(12) United States Patent
Ogata

(10) Patent No.: US 10,991,709 B2
(45) Date of Patent: *Apr. 27, 2021

(54) SEMICONDUCTOR DEVICE AND MANUFACTURING METHOD THEREOF

(71) Applicant: Renesas Electronics Corporation, Tokyo (JP)

(72) Inventor: Tamotsu Ogata, Tokyo (JP)

(73) Assignee: Renesas Electronics Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/813,699

(22) Filed: Mar. 9, 2020

(65) Prior Publication Data

US 2020/0212057 A1    Jul. 2, 2020

Related U.S. Application Data

(60) Continuation of application No. 16/264,558, filed on Jan. 31, 2019, now Pat. No. 10,593,687, which is a
(Continued)

(30) Foreign Application Priority Data

Mar. 30, 2015  (JP) .................................. 2015-070204

(51) Int. Cl.
*H01L 27/11568*    (2017.01)
*H01L 29/51*       (2006.01)
(Continued)

(52) U.S. Cl.
CPC .... *H01L 27/11568* (2013.01); *H01L 21/0217* (2013.01); *H01L 21/02164* (2013.01);
(Continued)

(58) Field of Classification Search
CPC ..................... H01L 27/11568; H01L 27/11573
See application file for complete search history.

(56) References Cited

U.S. PATENT DOCUMENTS

| 6,380,584 B1 | 4/2002 | Ogawa |
| 6,756,271 B1 | 6/2004 | Satoh et al. |
| (Continued) | | |

FOREIGN PATENT DOCUMENTS

| JP | 2001-044393 A | 2/2001 |
| JP | 2010-183022 A | 8/2010 |
| (Continued) | | |

OTHER PUBLICATIONS

Extended European Search Report dated Sep. 15, 2016, in European Patent Application No. EP16158178.0.
(Continued)

*Primary Examiner* — Eugene Lee
(74) *Attorney, Agent, or Firm* — SGPatents PLLC

(57) ABSTRACT

A semiconductor device whose performance is improved is disclosed. In the semiconductor device, an offset spacer formed in a memory cell is formed by a laminated film of a silicon oxide film and a silicon nitride film, and the silicon oxide film is particularly formed to directly contact the sidewall of a memory gate electrode and the side end portion of a charge storage film; on the other hand, an offset spacer formed in a MISFET is formed by a silicon nitride film. Particularly in the MISFET, the silicon nitride film directly contacts both the sidewall of a gate electrode and the side end portion of a high dielectric constant film.

11 Claims, 30 Drawing Sheets

Related U.S. Application Data division of application No. 15/786,944, filed on Oct. 18, 2017, now Pat. No. 10,438,961, which is a division of application No. 15/043,571, filed on Feb. 14, 2016, now Pat. No. 9,825,050.

(51) Int. Cl.

| | | |
|---|---|---|
| *H01L 29/792* | (2006.01) | |
| *H01L 29/423* | (2006.01) | |
| *H01L 27/11573* | (2017.01) | |
| *H01L 29/66* | (2006.01) | |
| *H01L 21/02* | (2006.01) | |
| *H01L 21/28* | (2006.01) | |

(52) U.S. Cl.
CPC .. *H01L 27/11573* (2013.01); *H01L 29/40117* (2019.08); *H01L 29/42344* (2013.01); *H01L 29/513* (2013.01); *H01L 29/518* (2013.01); *H01L 29/6656* (2013.01); *H01L 29/66545* (2013.01); *H01L 29/792* (2013.01)

(56) References Cited

U.S. PATENT DOCUMENTS

| | | | |
|---|---|---|---|
| 7,245,531 B2 | 7/2007 | Okazaki et al. | |
| 8,324,092 B2* | 12/2012 | Yasui | H01L 27/11568 438/593 |
| 8,357,968 B2 | 1/2013 | Chakihara et al. | |
| 8,716,089 B1 | 5/2014 | Hall et al. | |
| 8,815,675 B2 | 8/2014 | Sugiyama et al. | |
| 8,912,590 B2* | 12/2014 | Hirano | H01L 29/6659 257/324 |
| 8,916,432 B1 | 12/2014 | Ramkumar et al. | |
| 8,951,869 B2 | 2/2015 | Tsukamoto et al. | |
| 9,391,178 B2* | 7/2016 | Fukumura | G11C 16/0475 |
| 9,633,859 B2* | 4/2017 | Mihara | H01L 29/66833 |
| 9,825,050 B2 | 11/2017 | Ogata | |
| 2006/0094229 A1 | 5/2006 | Ema et al. | |
| 2007/0164342 A1 | 7/2007 | Okazaki et al. | |
| 2007/0218669 A1 | 9/2007 | Li et al. | |
| 2009/0001449 A1* | 1/2009 | Toba | H01L 27/11568 257/324 |
| 2009/0050955 A1 | 2/2009 | Akita et al. | |
| 2010/0200909 A1 | 8/2010 | Kawashima et al. | |
| 2010/0301404 A1 | 12/2010 | Kawashima | |
| 2011/0095348 A1 | 4/2011 | Chakihara et al. | |
| 2012/0068243 A1 | 3/2012 | Kawashima et al. | |
| 2013/0020622 A1 | 1/2013 | Saino | |
| 2013/0023101 A1 | 1/2013 | Chan et al. | |
| 2013/0240977 A1 | 9/2013 | Kaneoka et al. | |
| 2013/0256776 A1 | 10/2013 | Charpin-Nicolle | |
| 2014/0227843 A1 | 8/2014 | Tsukamoto et al. | |
| 2014/0302646 A1 | 10/2014 | Hirano et al. | |
| 2014/0312407 A1 | 10/2014 | Lee et al. | |
| 2014/0374814 A1 | 12/2014 | Wu et al. | |
| 2015/0145023 A1 | 5/2015 | Arigane et al. | |
| 2016/0141298 A1 | 5/2016 | Chuang et al. | |
| 2017/0221917 A1 | 8/2017 | Shinohara | |
| 2017/0352675 A1 | 12/2017 | Mihara | |
| 2018/0090365 A1 | 3/2018 | Kamoshima et al. | |
| 2018/0090626 A1 | 3/2018 | Yamashita | |
| 2018/0286881 A1 | 10/2018 | Yamakosh et al. | |

FOREIGN PATENT DOCUMENTS

| | | |
|---|---|---|
| JP | 2013-026494 A | 2/2013 |
| JP | 2014-154790 A | 8/2014 |
| JP | 2015-032741 A | 2/2015 |

OTHER PUBLICATIONS

Office Action dated Jul. 10, 2018, in Japanese Patent Application No. 2015-070204.
Office Action dated Nov. 27, 2018, in Japanese Patent Application No. 2015-070204.
Office Action dated Mar. 28, 2019, in Taiwanese Patent Application No. 105103536.
Office Action dated Jun. 24, 2019, in Chinese Patent Application No. 201610147916.9.

* cited by examiner

FIG. 4

| | OPERATION MODE WRITING/ERASING | WRITING OPERATION VOLTAGE (V) Vmg/Vs/Vcg/Vd/Vb | ERASING OPERATION VOLTAGE (V) Vmg/Vs/Vcg/Vd/Vb | READING OPERATION VOLTAGE (V) Vmg/Vs/Vcg/Vd/Vb |
|---|---|---|---|---|
| A | SSI (WRITING)/ BTBT (ERASING) | 10/5/1/0.5/0 | -6/6/0/OPEN/0 | 0/0/1.5/1.5/0 |
| B | SSI (WRITING)/ FN (ERASING) | 10/5/1/0.5/0 | 12/0/0/0/0 | 0/0/1.5/1.5/0 |
| C | FN (WRITING)/ BTBT (ERASING) | -12/0/0/0/0 | -6/6/0/OPEN/0 | 0/0/1.5/1.5/0 |
| D | FN (WRITING)/ FN (ERASING) | -12/0/0/0/0 | 12/0/0/0/0 | 0/0/1.5/1.5/0 |

SEMICONDUCTOR DEVICE AND MANUFACTURING METHOD THEREOF

CROSS-REFERENCE TO RELATED APPLICATIONS

The disclosure of Japanese Patent Application No. 2015-070204 filed on Mar. 30, 2015 including the specification, drawings and abstract is incorporated herein by reference in its entirety.

BACKGROUND

The present invention relates to a semiconductor device and a manufacturing method thereof, and for example, to an effective technique that can be applied to a semiconductor device having an electrically rewritable non-volatile memory and a manufacturing technique thereof.

EEPROMs (Electrically Erasable and Programmable Read Only Memories) and flash memories are widely used as non-volatile semiconductor memory devices in which information can be electrically written and erased. These non-volatile semiconductor memory devices (non-volatile memories) represented by the EEPROMs and flash memories that are widely used at present have a charge storage film, such as a conductive floating gate electrode or a trap insulating film that is surrounded by a silicon oxide film, below the gate electrode of a MOS (Metal Oxide Semiconductor) transistor. The non-volatile memory stores information by using the fact that the threshold value of a transistor varies depending on a state where charges are stored in the floating gate electrode or the trap insulating film.

The trap insulating film refers to an insulating film having trap levels in which charges can be stored, and a silicon nitride film, or the like, can be cited as one example of the trap insulating film. A non-volatile semiconductor memory device having a trap insulating film is operated as a storage element in which the threshold value of a MOS transistor is shifted by injecting and eliminating charges into/from the trap insulating film. A non-volatile semiconductor memory device, having such a trap insulating film as a charge storage film, is referred to as a MONOS (Metal Oxide Nitride Oxide Semiconductor) type transistor, and is more excellent in data holding reliability because charges are stored in discrete trap levels, in comparison with the case where a conductive floating gate electrode is used as a charge storage film.

For example, Japanese Unexamined Patent Application Publication No. 2014-154790 (Patent Document 1) describes a technique in which both a memory cell including a MONOS type transistor and a MOS transistor that forms a peripheral circuit represented by a logic circuit are mounted in a mixed way.

Japanese Unexamined Patent Application Publication No. 2013-026494 (Patent Document 2) describes a technique with respect to an offset spacer and describes the fact that, when a silicon oxide film is used as the offset spacer particularly in a MISFET using a high dielectric constant film for a gate insulating film, variations are caused in the characteristics of the gate insulating film.

A MISFET (Metal Insulator Semiconductor Field Effect Transistor) that uses a high dielectric constant film containing a metal compound in a gate insulating film and uses a metal film in a gate electrode (hereinafter, referred to as an HKMG-MISFET) is used in a CMOS circuit of 32 nm node and beyond in which scaling has progressed. For example, in a semiconductor device in which a system including a non-volatile memory is formed, a MONOS type transistor and an HKMG-MISFET are mounted over the same semiconductor substrate in a mixed way. Herein, when an extension region of the MONOS type transistor or the HKMG-MISFET is formed, ions are injected in a state where an offset spacer is formed over the sidewall of the gate electrode, from the viewpoint of securing an effective channel length in order to suppress a short channel effect. In this case, it can be considered that an offset spacer to be used in the MONOS type transistor and that to be used in the HKMG-MISFET are formed by the same material, from the viewpoint of simplifying steps.

However, when the offset spacers are formed, for example, by a silicon oxide film, the same material, there is the concern that oxygen originating from the silicon oxide film that forms the offset spacer may enter a gate insulating film when a heat treatment for impurity activation is performed in the HKMG-MISFET, thereby possibly causing variations in the characteristics of the gate insulating film. In particular, in an HKMG-MISFET using a high dielectric constant film containing a metal compound in a gate insulating film, variations in the characteristics of the HKMG-MISFET, resulting from the entry of oxygen from an offset spacer into the gate insulating film, are revealed. From this, it is desirable not to use a silicon oxide film in the offset spacer in an HKMG-MISFET.

On the other hand, when offset spacers are formed, for example, by a silicon nitride film, the same material, the offset spacer including the silicon nitride film is formed to contact the sidewall of the gate electrode in the MONOS type transistor. In this case, the silicon nitride film has a charge storage function, and hence there is the possibility that a hot electron, generated when a writing operation is performed, may be trapped by the offset spacer including the silicon nitride film in the vicinity of the end portion of the gate electrode. And, there is the concern that, while writing operations are being repeated, charges are further stored in the offset spacer, thereby causing the threshold voltage in the vicinity of the end portion of the gate electrode to be increased. Such an increase in the threshold voltage will cause both degradation of a transconductance (gm), which is a ratio of a change in a drain current to a change in a gate voltage, and a decrease in a read-out current. From this, it is desirable not to use a silicon nitride film in an offset spacer in a MONOS type transistor.

From the facts mentioned above, it is desirable to devise offset spacers from the viewpoint of improving the characteristics of both a MONOS type transistor and an HKMG-MISFET.

Other challenges and new characteristics will become clear from the description and accompanying drawings of the present specification.

In a semiconductor device in one embodiment, an offset spacer in a MONOS type transistor is formed by a single layer film of a silicon oxide film or a laminated film including a silicon oxide film, while that in an HKMG-MISFET is formed by a silicon nitride film.

A manufacturing method of a semiconductor device in one embodiment includes the steps of: forming a silicon oxide film that contacts a side end portion of a charge storage film in a memory cell formation region; and forming a silicon nitride film that contacts a side end portion of a gate insulating film in a peripheral circuit formation region.

Advantage of the Invention

According to one embodiment, the performance of a semiconductor device can be improved.

BRIEF DESCRIPTION OF THE DRAWINGS

FIG. 4 is a table showing an example of the conditions under which voltages are applied to the respective parts of a selected memory cell when "writing", "erasing", or "reading" is performed, in First Embodiment;

DETAILED DESCRIPTION

Figure 1:
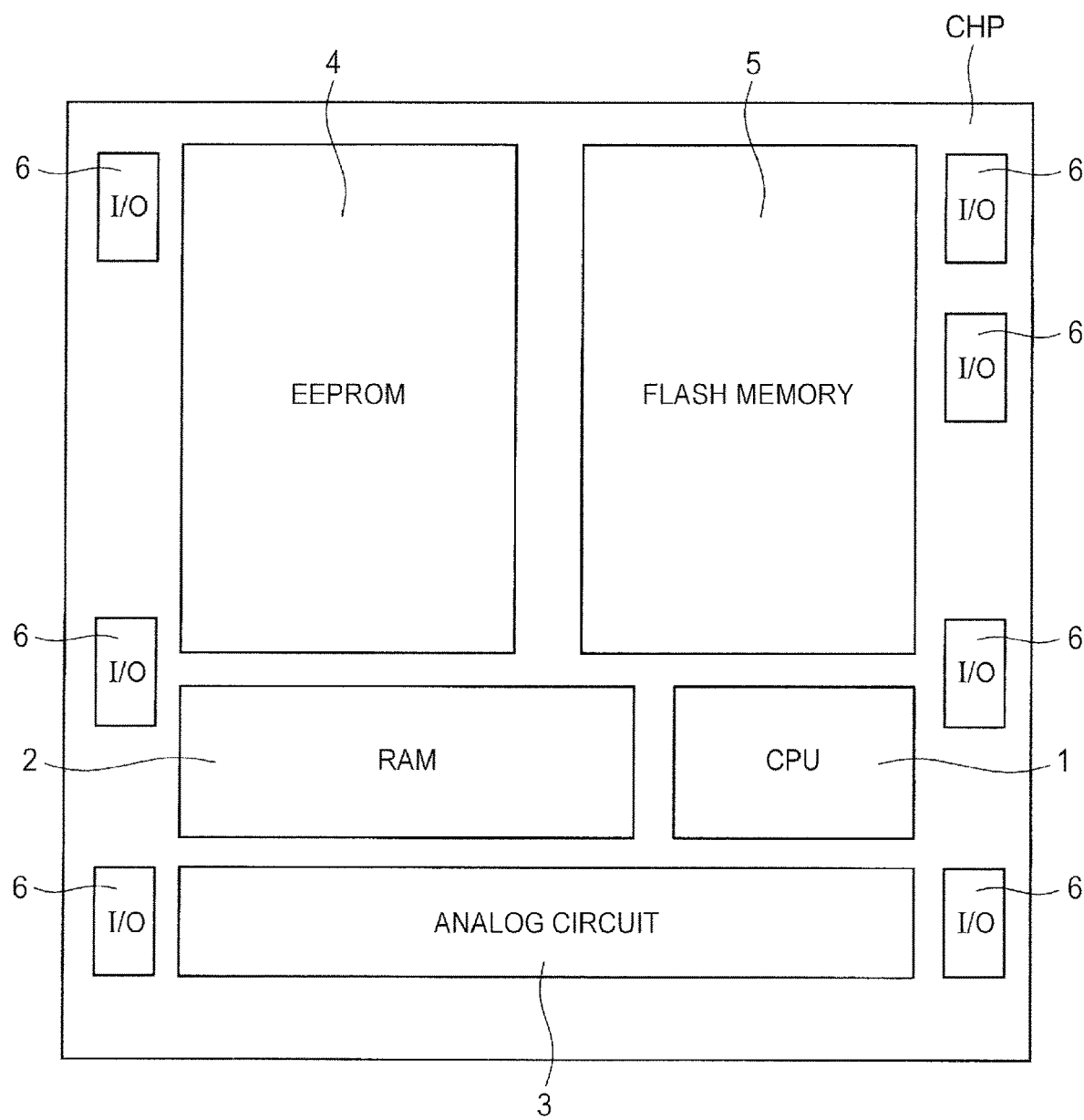
FIG. 1 is a view illustrating an example of a layout configuration of a semiconductor chip in First Embodiment.

When necessary for convenience in the following embodiment, description is given by dividing the embodiment into a plurality of sections or embodiments; however, unless otherwise indicated, they are not independent of one another, but one is related with the other part or the whole as a modification, a detail, supplementary description, etc.

When the numbers of elements, etc. (including numbers of pieces, numerical values, amounts, ranges, etc.) are referred to in the following embodiments, the numbers are not limited to the specific ones but may be more or less than the specific numbers, unless otherwise indicated or except when the numbers are obviously limited to the specific numbers in principle.

Further, in the following embodiments, it is needless to say that components (also including constituent steps, etc.) are not necessarily requisite unless stated explicitly or except when they are obviously requisite in principle.

Similarly, when referring to the shapes and positional relations, etc., of components, etc., in the following embodiment, unless stated explicitly or except when they can be thought otherwise in principle, those substantially the same or similar to the shapes, etc., are to be included. This also applies to the aforementioned numerical values and ranges.

In addition, like components are denoted with like reference numerals in principle in each of the views for explaining embodiments, and duplicated descriptions are omitted. For easy understanding of drawings, hatching lines may be drawn even in a plan view.

First Embodiment

Example of Layout Configuration of Semiconductor Chip

A semiconductor device having a non-volatile memory in First Embodiment will be described with reference to the accompanying drawings. The layout configuration of a semiconductor device (semiconductor chip), in which a system including a non-volatile memory is formed, will be first described. FIG. 1 is a view illustrating an example of a layout configuration of a semiconductor chip CHP in First Embodiment. The semiconductor chip CHP has a CPU (Central Processing Unit) 1, a RAM (Random Access Memory) 2, an analog circuit 3, an EEPROM (Electrically Erasable Programmable Read Only Memory) 4, a flash memory 5, and I/O (Input/Output) circuits 6.

The CPU (circuit) 1 is also referred to as a central processing unit, and corresponds to the heart of a computer, or the like. This CPU1 reads out commands from a storage device to decode them, and performs various operations and controls based on the commands.

The RAM (circuit) 2 is a memory from which storage information can be read out at random, i.e., storage information that are stored can be read out if necessary, or into which information to be stored can be written, and is also referred to as a random access memory. The RAM as an IC memory includes a DRAM (Dynamic RAM) using a dynamic circuit and an SRAM (Static RAM) using a static circuit. The DRAM is a random access memory that requires memory holding operations, while the SRAM is a random access memory that does not require such operations.

The analog circuit 3 is a circuit that deals with a voltage signal or a current signal continuously changing in time, i.e., an analog signal, and is formed, for example, by an amplifying circuit, a conversion circuit, a modulation circuit, an oscillating circuit, a power supply circuit, etc.

Each of the EEPROM 4 and the flash memory 5 is one type of non-volatile memories in which both a writing operation and an erasing operation are electrically rewritable, which is also referred to as an electrically erasable programmable read only memory. A memory cell of each of the EEPROM 4 and the flash memory 5 is formed, for example, by a MONOS (Metal Oxide Nitride Oxide Semiconductor) type transistor or an MNOS (Metal Nitride Oxide Semiconductor) type transistor that is used for memory. A writing operation or an erasing operation for each of the EEPROM 4 and the flash memory 5 is performed by using, for example, Fowler-Nordheim Tunnel phenomenon. It is also possible to perform a writing operation or an erasing operation by using a hot electron or a hot hole. The difference between the EEPROM 4 and the flash memory 5 is that the former is a non-volatile memory in which information can be erased, for example, in byte units, while the latter is one in which information can be erased, for example, in word line units. The flash memory 5 generally stores programs for performing various processing in the CPU 1. On the other hand, the EEPROM 4 stores various data that are frequently rewritten.

The I/O circuit 6 is an input/output circuit, i.e., a circuit for outputting data from the semiconductor chip CHP to a device coupled to the outside of the semiconductor chip CHP and for vice versa.

Device Structure of Semiconductor Device

Figure 2:
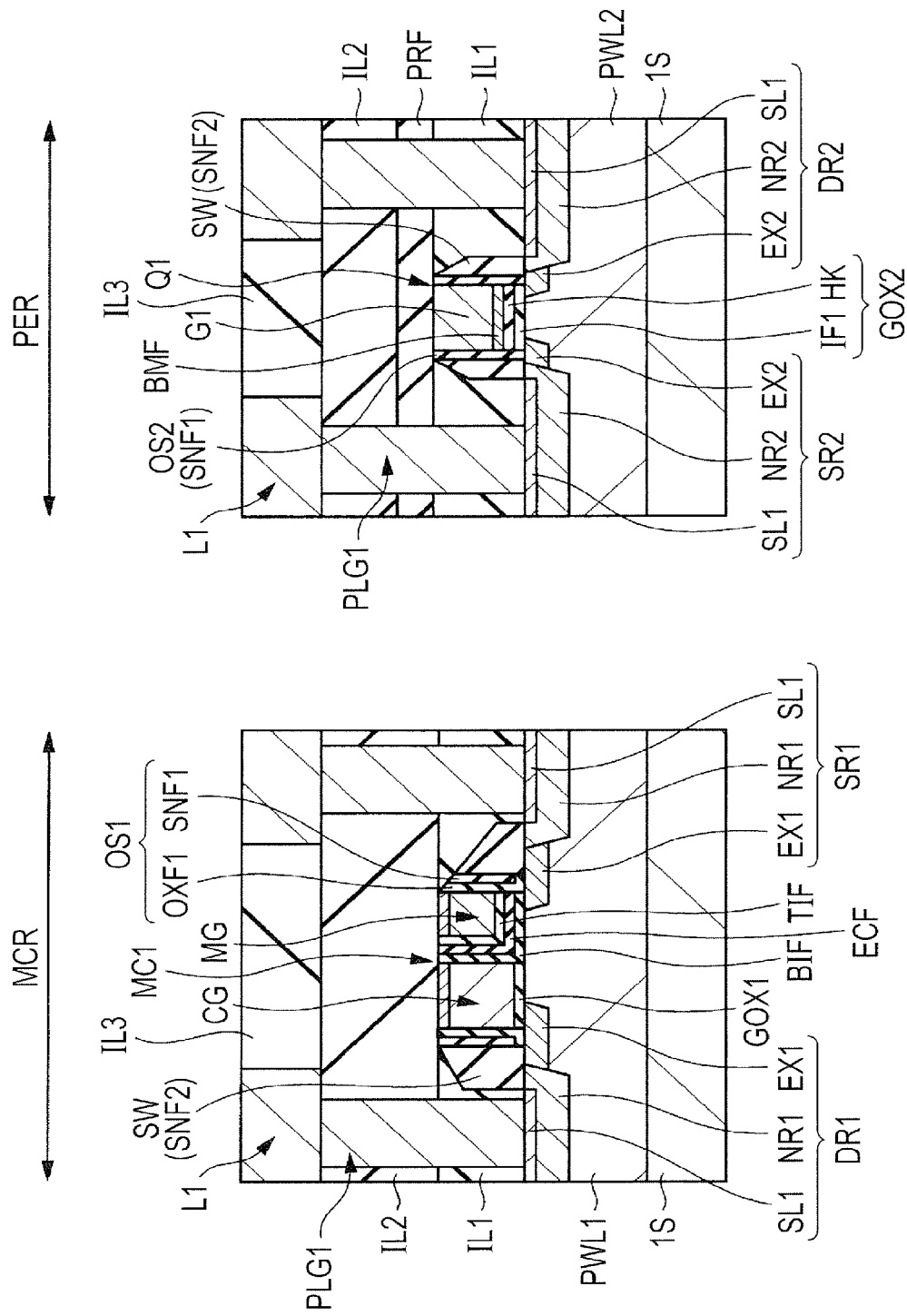
FIG. 2 is a sectional view for explaining an example of a device structure of a semiconductor device in First Embodiment.

FIG. 2 is a sectional view for explaining an example of a device structure of the semiconductor device in First Embodiment. In FIG. 2, a memory cell MC1 formed in a memory cell formation region MCR and a MISFET Q1 formed in a peripheral circuit formation region PER are illustrated.

The semiconductor device in First Embodiment is formed in the semiconductor chip CHP illustrated in FIG. 1, and the memory cell MC1 in FIG. 2 is, for example, a memory cell that forms the EEPROM 4 or the flash memory 5 illustrated in FIG. 1. On the other hand, the MISFET Q1 illustrated in FIG. 2 is a MISFET formed in the peripheral circuit formation region PER. The peripheral circuit formation region PER represents a region where a peripheral circuit is formed. Specifically, the non-volatile memory is formed by: the memory cell formation region MCR where memory cells are formed in an array pattern (matrix pattern); and the peripheral circuit formation region PER where a peripheral circuit, for controlling the memory cell MC1 formed in the memory cell formation region MCR, is formed. The peripheral circuit formed in the peripheral circuit formation region PER is formed by: a word driver for controlling a voltage to be applied to the control gate electrode, etc., of the memory cell MC1; a sense amplifier for amplifying an output from the memory cell MC1; a control circuit for controlling the word driver or the sense amplifier; and the like. Accordingly, the MISFET Q1, which forms, for example, the word driver, the sense amplifier, the control circuit, or the like, is illustrated in the peripheral circuit formation region PER illustrated in FIG. 2.

An n-channel type MISFET will be described as an example in First Embodiment, but a p-channel type MISFET may also be formed. However, description of the p-channel type MISFET will be omitted in consideration that the device structure thereof is basically one in which the conductivity type of a component (semiconductor region, etc.) of the n-channel type MISFET is reversed.

The configuration of the memory cell MC1, formed in the memory cell formation region MCR, will be first described with reference to FIG. 2. A p-type well PWL1 is formed over a semiconductor substrate 1S, as illustrated in FIG. 2. The memory cell MC1 is formed over the p-type well PWL1. The memory cell MC1 is formed by both a selection part for selecting the memory cell MC1 and a storage part for storing information.

The configuration of the selection part for selecting the memory cell MC1 will be first described. The memory cell MC1 has a gate insulating film GOX1 formed over the semiconductor substrate 1S (p-type well PWL1), and a control gate electrode (control electrode) CG is formed over the gate insulating film GOX1.

The gate insulating film GOX1 is formed, for example, by a silicon oxide film, and the control gate electrode CG is formed, for example, by a polysilicon film and a silicide film formed over the surface of the polysilicon film.

The aforementioned control gate electrode CG has the function of selecting the memory cell MC1. That is, the specific memory cell MC1 is selected by the control gate electrode CG such that a writing operation, an erasing operation, or a reading operation is performed on the selected memory cell MC1.

Subsequently, the configuration of the storage part of the memory cell MC1 will be described. A memory gate electrode MG is formed, via a laminated insulating film, over the sidewall on one side (sidewall on the right side) of a laminated structure body including the gate insulating film GOX1 and the control gate electrode CG. The memory gate electrode MG has a sidewall-like shape formed over the sidewall on the one side of the laminated structure body, and is formed by both a polysilicon film and a silicide film formed thereover. The silicide film is formed in order to lower the resistance of the memory gate electrode MG and is formed, for example, by a nickel-platinum silicide film (NiPtSi film), but is not limited thereto and can also be formed by a cobalt silicide film or a nickel silicide film.

A laminated insulating film, having both a first portion formed between the sidewall on the one side of the laminated structure body and the memory gate electrode MG and a second portion formed between the memory gate electrode MG and the semiconductor substrate 1S, is formed. The first portion of the laminated insulating film is formed by: an insulating film BIF that contacts the control gate electrode CG; an insulating film TIF that contacts the memory gate electrode MG; and a charge storage film ECF sandwiched by the above insulating films BIF and TIF. The second portion of the laminated insulating film is formed by: the insulating film BIF formed over the semiconductor substrate 1S; the insulating film TIF formed below the memory gate electrode MG; and the charge storage film ECF sandwiched by the above insulating films BIF and TIF. That is, the first portion and the second portion of the laminated insulating film are both formed by the insulating film BIF, the insulating film TIF, and the charge storage film ECF.

The insulating film BIF is formed, for example, by an insulating film, such as a silicon oxide film or a silicon oxynitride film, and functions as a gate insulating film formed between the memory gate electrode MG and the semiconductor substrate 1S. The insulating film BIF including a silicon oxide film also has a function as a tunnel insulating film. For example, the storage part of the memory cell MC1 performs storage or erasure of information by injecting electrons from the semiconductor substrate 1S into the charge storage film ECF via the insulating film BIF, or by injecting holes into the charge storage film ECF; and hence the insulating film BIF functions also as a tunnel insulating film.

The charge storage film ECF formed over the insulating film BIF has a charge storage function. Specifically, the charge storage film ECF is formed by a silicon nitride film in First Embodiment. The storage part of the memory cell MC1 in First Embodiment stores information by controlling a current flowing through the semiconductor substrate 1S below the memory gate electrode MG depending on the presence/absence of a charge stored in the charge storage film ECF. That is, the storage part stores information by using the fact that the threshold voltage of a current flowing through the semiconductor substrate 1S below the memory gate electrode MG is changed depending on the presence/absence of a charge stored in the charge storage film ECF.

An insulating film having a trap level is used as the charge storage film ECF in First Embodiment. A silicon nitride film can be cited as one example of the insulating film having a trap level, but without being limited thereto, a high dielectric constant film having a dielectric constant higher than that of a silicon nitride film, such as, for example, an aluminum oxide (alumina) film, a hafnium oxide film, a tantalum oxide film, or the like, may be used. Alternatively, the charge storage film ECF may be formed by silicon nanodot. When an insulating film having a trap level is used as the charge storage film ECF, a charge is trapped by the trap level formed in the insulating film. Charges are stored in the insulating film by thus trapping a charge in the trap level.

A polysilicon film has mainly been used as the charge storage film ECF until now, but in this case, there is the possibility that, if the insulating film BIF or the insulating film TIF, which surrounds the charge storage film ECF, is partially defective, all of the charges stored in the charge storage film ECF may leak out due to abnormal leakage because the charge storage film ECF is a conductive film.

Accordingly, a silicon nitride film that is an insulator has been used as the charge storage film ECF. In this case, the charges that contribute to data storage are stored in discrete trap levels present in the silicon nitride film. Accordingly, the charges are stored in the discrete trap levels in the charge storage film ECF even if the insulating film BIF or the insulating film TIF, which surrounds the charge storage film ECF, is partially defective, and hence it never happens that all of the charges may leak out of the charge storage film ECF. Thereby, the data holding reliability can be improved.

From such a reason, the data holding reliability can be improved by using, as the charge storage film ECF, a film including discrete trap levels, without being limited to a silicon nitride film. Further, a silicon nitride film excellent in a data holding property is used as the charge storage film ECF in First Embodiment. Accordingly, the thickness of each of the insulating film BIF and the insulating film TIF, which are provided in order to prevent leakage of the charges from the charge storage film ECF, can be made small. Thereby, First Embodiment also has the advantage that the voltage for driving the memory cell MC1 can be reduced.

Additionally, the insulating film TIF is an insulating film for securing the insulation between the charge storage film ECF and the memory gate electrode MG. The insulating film TIF is formed by an insulating film, such as, for example, a silicon oxide film or a silicon oxynitride film. Accordingly, the insulating film BIF and the insulating film TIF are formed by films of the same type. Both the insulating film BIF and the insulating film TIF can be formed, for example, by a silicon oxide film.

Subsequently, the memory gate electrode MG is formed over the sidewall on one side (on the right side) of the laminated structure body, while an offset spacer OS1 is formed over the sidewall on the other side (on the left side) thereof, and a sidewall spacer SW is formed outside the offset spacer OS1. Similarly, the laminated structure body is formed, via the laminated insulating film, over the sidewall on one side (on the left side) of the memory gate electrode MG, while the offset spacer OS1 is formed over the sidewall on the other side (on the right side) thereof, and the sidewall spacer SW is formed outside the offset spacer OS1. In this case, the offset spacer OS1 formed on the right side of the memory gate electrode MG is formed by: a silicon oxide film OXF1 that directly contacts the sidewall of the memory gate electrode MG and the side end portion of the charge storage film ECF; and a silicon nitride film SNF1 formed outside the silicon oxide film OXF1, in First Embodiment. The sidewall spacer SW is formed, for example, by a silicon nitride film SNF2.

In the semiconductor substrate 1S immediately below the offset spacer OS1 and the sidewall spacer SW, a pair of shallow low-concentration impurity diffusion regions EX1, which are n-type semiconductor regions, are formed, and a pair of deep high-concentration impurity diffusion regions NR1 are formed in regions that are located adjacent to and outside the shallow low-concentration impurity diffusion regions EX1. The deep high-concentration impurity diffusion region NR1 is also an n-type semiconductor region, and a silicide film SL1 is formed over the surface of the deep high-concentration impurity diffusion region NR1. A source region SR1 and a drain region DR1 of the memory cell are formed by the shallow low-concentration impurity diffusion regions EX1, the deep high-concentration impurity diffusion regions NR1, and the silicide film SL1.

By forming each of the source region SR1 and the drain region DR1 by the shallow low-concentration impurity diffusion region EX1 and the deep high-concentration impurity diffusion region NR1, each of them can be allowed to have an LDD (Lightly Doped Drain) structure.

Herein, a transistor, formed by: the gate insulating film GOX1; the control gate electrode CG formed over the gate insulating film GOX1; and the aforementioned source region SR1 and drain region DR1, is referred to as a select transistor. On the other hand, a transistor, formed by: the laminated insulating film including the insulating film BIF, the charge storage film ECF, and the insulating film TIF; the memory gate electrode MG formed over the laminated insulating film; and the aforementioned source region SR1 and drain region DR1, is referred to as a memory transistor. Thereby, it can be said that the selection part of the memory cell MC1 is formed by the select transistor and the storage part thereof is formed by the memory transistor. The memory cell MC1 is thus formed.

Subsequently, a wiring structure to be coupled to the memory cell MC1 will be described. In FIG. 2, an interlayer insulating film IL1 including, for example, a silicon oxide film is formed in the same layer as that of the memory cell MC1, and an interlayer insulating film IL2 including a silicon oxide film is formed over the interlayer insulating film IL1. In the present specification, the interlayer insulating film IL1 and the interlayer insulating film IL2 are collectively referred to as a contact interlayer insulating film.

A contact hole, which penetrates the contact interlayer insulating film to reach the silicide film SL1 that forms the drain region DR1, is formed in the contact interlayer insulating film. Similarly, a contact hole, which reaches the silicide film SL1 that forms the source region SR1, is also formed in the contact interlayer insulating film.

A titanium/titanium nitride film, which is a barrier conductor film, is formed in the contact hole and a tungsten film is formed to fill up the contact hole. A conductive plug PLG1 is formed by thus embedding the titanium/titanium nitride film and the tungsten film in the contact hole. An interlayer insulating film IL3 including, for example, a silicon oxide film and a SiOC film is formed over the contact interlayer insulating film, and a wiring trench is formed in the interlayer insulating film IL3. Wiring L1 is formed to fill up the wiring trench. The wiring L1 is formed by a laminated film, for example, of a tantalum/tantalum nitride film and a copper film, and is electrically coupled to the plug PLG1 formed in the contact interlayer insulating film.

Subsequently, the configuration of the MISFET Q1 formed in the peripheral circuit formation region PER will be described with reference to FIG. 2.

In the peripheral circuit formation region PER, a p-type well PWL2 is formed over the semiconductor substrate 1S, as illustrated in FIG. 2. The P-type well PWL2 is formed by a p-type semiconductor region where p-type impurities, such as boron (B), have been introduced into the semiconductor substrate 1S.

Subsequently, a gate insulating film GOX2 is formed over the p-type well PWL2 (semiconductor substrate 1S), and a gate electrode G1 is formed over the gate insulating film GOX2. The gate insulating film GOX2 is formed, for example, by: an interface layer including an insulating film IF1 (silicon oxide film); and a high dielectric constant film HK formed over the interface layer. The gate electrode G1 is formed, for example, by: a barrier metal film BMF formed over the gate insulating film GOX2; and a low-resistance metal film represented, for example, by an aluminum film.

Herein, the high dielectric constant film HK, which forms part of the gate insulating film GOX2, includes a metal compound film. The high dielectric constant film HK is defined, for example, as a film having a dielectric constant higher than that of silicon nitride film, and is formed by a film containing a metal compound represented by a metal oxide. For example, a hafnium oxide film ($HfO_2$ film), which is one of hafnium oxides, is used as the high dielectric constant film HK. However, other hafnium-based insulating films, such as an HfAlO film (hafnium aluminate film), HfON film (hafnium oxynitride film), HfSiO film (hafnium silicate film), and HfSiON film (hafnium silicon oxynitride film), can also be used in place of a hafnium oxide film. Also, hafnium-based insulating films, obtained by introducing oxides, such as a tantalum oxide, a niobium oxide, a titanium oxide, a zirconium oxide, a lanthanum oxide, and an yttrium oxide, into these hafnium-based insulating films, can be used.

From the facts mentioned above, the MISFET Q1 in First Embodiment is formed by an HKMG-MISFET.

An offset spacer OS2 including, for example, the silicon nitride film SNF1 is formed on each of the sidewalls on both the sides of the gate electrode G1, and the sidewall spacer SW including the silicon nitride film SNF2 is formed outside the offset spacer OS2. A shallow low-concentration impurity diffusion region EX2 is formed in the semiconductor substrate 1S (p-type well PWL2) immediately below the offset spacer OS2. The shallow low-concentration impurity diffusion region EX2 is an n-type semiconductor region, and is formed to be aligned with the gate electrode G1. A deep high-concentration impurity diffusion region NR2 is formed outside the shallow low-concentration impurity diffusion region EX2. The deep high-concentration impurity diffusion region NR2 is also an n-type semiconductor region, and is formed to be aligned with the sidewall spacer SW. The silicide film SL1 for lowering resistance is formed over the surface of the deep high-concentration impurity diffusion region NR2. A source region SR2 is formed by the shallow low-concentration impurity diffusion region EX2 on one side, the deep high-concentration impurity diffusion region NR2 on one side, and the silicide film SL1; while a drain region DR2 is formed by the shallow low-concentration impurity diffusion region EX2 on the other side, the deep high-concentration impurity diffusion region NR2 on the other side, and the silicide film SL1. Thus, the MISFET Q1 is formed in the peripheral circuit formation region PER.

Subsequently, a wiring structure to be coupled to the MISFET Q1 formed in the peripheral circuit formation region PER will be described. A contact interlayer insulating film, including the interlayer insulating film IL1, a protective film PRF, and the interlayer insulating film IL2, is formed over the MISFET Q1 so as to cover the MISFET Q1.

A contact hole, which penetrates the contact interlayer insulating film to reach the silicide film SL1 that forms the source region SR2 and the drain region DR2, is formed in the contact interlayer insulating film. A titanium/titanium nitride film, which is a barrier conductor film, is formed in the contact hole and a tungsten film is formed to fill up the contact hole. A conductive plug PLG1 is formed by thus embedding the titanium/titanium nitride film and the tungsten film in the contact hole. An interlayer insulating film IL3 including, for example, a silicon oxide film and a SiOC film is formed over the contact interlayer insulating film, and a wiring trench is formed in the interlayer insulating film IL3. Wiring L1 is formed to fill up the wiring trench. The wiring L1 is formed by a laminated film, for example, of a tantalum/tantalum nitride film and a copper film, and is electrically coupled to the plug PLG1 formed in the contact interlayer insulating film.

Operations of Non-Volatile Memory

Figure 3:
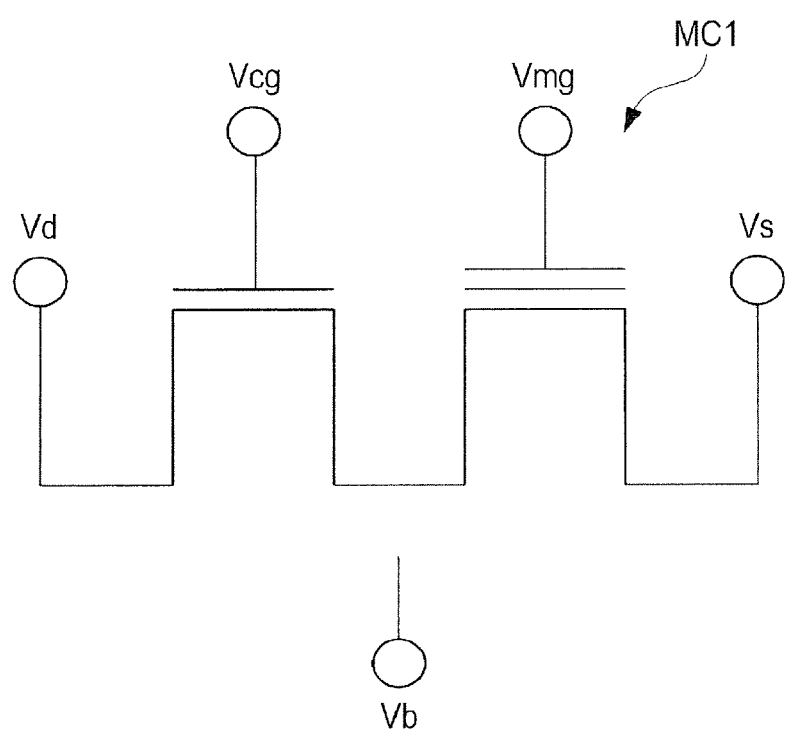
FIG. 3 is a view illustrating a schematic circuit configuration of a memory cell in First Embodiment.

Subsequently, an example of the operations of the non-volatile memory in First Embodiment will be described. FIG. 3 is a view illustrating a schematic circuit configuration of the memory cell MC1 in First Embodiment. FIG. 4 is a table showing an example of the conditions under which voltages are applied to the respective parts of a selected memory cell when "writing", "erasing", or "reading" is performed, in First Embodiment. A voltage Vmg to be applied to the memory gate electrode MG of the memory cell MC1 illustrated in FIG. 3, a voltage Vs to be applied to the source region, a voltage Vcg to be applied to the control gate electrode CG, a voltage Vd to be applied to the drain region, and a base voltage Vb to applied to the p-type well PWL1, which are applied when each of "writing", "erasing", and "reading" is performed, are listed in the table illustrated in FIG. 4.

The conditions shown in the table of FIG. 4 are examples suitable for applying voltages, but various conditions can be adopted, if necessary, without being limited thereto. In First Embodiment, the injection of electrons into the charge storage film ECF of the memory transistor is defined as "writing", while the injection of holes thereinto is defined as "erasing."

In the table illustrated in FIG. 4, the A column corresponds to the case where a writing method is an SSI system and an erasing method is a BTBT system; and the B column corresponds to the case where a writing method is an SSI system and an erasing method is an FN system. The C column corresponds to the case where a writing method is an FN system and an erasing method is a BTBT system; and the D column corresponds to the case where a writing method is an FN system and an erasing method is an FN system.

It can be considered that: the SSI system is an operation system in which writing into the memory cell MC1 is performed by injecting hot electrons into the charge storage film ECF; and the BTBT system is an operation system in which erasing of the memory cell MC1 is performed by injecting hot holes into the charge storage film ECF. Additionally, it can be considered that the FN system is an operation system in which writing or erasing is performed by tunneling electrons or holes. In other words, with respect to the FN system, writing according to the system can be considered as an operation system in which writing into the memory cell MC1 is performed by injecting electrons into the charge storage film ECF with an FN tunneling effect, and erasing according thereto can be considered as an operation system in which erasing of the memory cell MC1 is performed by injecting holes thereinto with an FN tunneling effect. Hereinafter, specific description will be made.

There are two types of wring systems: in one system of which (hot electron injection writing system) that is referred to as a so-called SSI (Source Side Injection) system, writing is performed by injecting hot electrons with the use of source-side injection: and in the other system of which (tunneling writing system) that is referred to as a so-called FN system, writing is performed by FN tunneling.

In writing according to the SSI system, for example, the voltages listed in the "Writing Operation Voltage" in the A column or the B column of the table illustrated in FIG. 4 (Vmg=10 v, Vs=5 V, Vcg=1 V, Vd=0.5 V, and Vb=0 V) are applied to the respective parts of the selected memory cell into which writing is to be performed, so that writing is performed by injecting electrons into the charge storage film ECF in the selected memory cell. In this case, hot electrons are generated in a channel region below a portion between the memory gate electrode MG and the control gate electrode CG, and the hot electrons are injected into the charge storage film ECF below the memory gate electrode MG. The injected hot electrons are trapped by the trap levels in the charge storage film ECF, thereby allowing the threshold voltage of the memory transistor to be increased. That is, the memory transistor is brought into a write state.

In writing according to the FN system, for example, the voltages listed in the "Writing Operating Voltage" in the C column or the D column of the table illustrated in FIG. 4 (Vmg=-12 V, Vs=0 V, Vcg=0 V, Vd=0 V, and Vb=0 V) are applied to the respective parts of the selected memory cell into which writing is to be performed, so that writing is performed in the selected memory cell by tunneling electrons from the memory gate electrode MG and injecting them into the charge storage film ECF. In this case, electrons are tunneled from the memory gate electrode MG through the insulating film TIF by an FN tunneling phenomenon and are injected into the charge storage film ECF. The electrons are then trapped by the trap levels in the charge storage film ECF, thereby allowing the threshold voltage of the memory transistor to be increased. That is, the memory transistor is brought into a write state.

Alternatively, in the writing according to the FN system, writing can also be performed by tunneling electrons from the semiconductor substrate 1S and injecting them into the charge storage film ECF. In this case, the writing operation voltages may be ones obtained, for example, by inverting the positive/negative of the "Writing Operation Voltage" in the C column or the D column of the table illustrated in FIG. 4.

There are two types of erasing methods: in one system of which (hot-hole injection erasing system) that is referred to as a so-called BTBT (Band-To-Band Tunneling) system, erasing is performed by injecting hot holes with the use of a BTBT phenomenon; and in the other system of which (tunneling erasing system) that is referred to as a so-called FN system, erasing is performed by FN tunneling.

In erasing according to the BTBT system, erasing is performed by injecting the holes generated by a BTBT phenomenon into the charge storage film ECF. For example, the voltages listed in the "Erasing Operation Voltage" in the A column or the C column of the table illustrated in FIG. 4 (Vmg=-6 V, Vs=6 V, Vcg=0 V, Vd=open, Vb=0 V) are applied to the respective parts of the selected memory cell in which erasing is to be performed. With this, holes are generated by a BTBT phenomenon and accelerated under an electric field in order to be injected into the charge storage film ECF of the selected memory cell, thereby allowing the threshold voltage of the memory transistor to be reduced. That is, the memory transistor is brought into an erasing state.

In erasing according to the FN system, for example, the voltages listed in the "Erasing Operation Voltage" in the B column or the D column of the table illustrated in FIG. 4 (Vmg=12 v, Vs=0 V, Vcg=0 V, Vd=0 V, and Vb=0 V) are applied to the respective parts of the selected memory cell in which erasing is to be performed, so that erasing is performed by tunneling holes from the memory gate electrode MG and injecting them into the charge storage film ECF in the selected memory cell. In this case, holes are tunneled from the memory gate electrode MG through the insulating film TIF by FN tunneling and injected into the charge storage film ECF. The holes are then trapped by the trap levels in the charge storage film ECF, thereby allowing the threshold voltage of the memory transistor to be reduced. That is, the memory transistor is brought into an erasing state.

Alternatively, in the erasing according to the FN system, erasing can also be performed by tunneling holes from the semiconductor substrate 1S and injecting them into the charge storage film ECF. In this case, the erasing operation voltages may be ones obtained, for example, by inverting the positive/negative of the "Erasing Operation Voltage" in the B column or the D column of the table illustrated in FIG. 4.

When writing or erasing is performed according to the FN system (i.e., in the case of the operation system B, C, or D) and when charges are tunneled from the memory gate electrode MG and injected into the charge storage film ECF, it is desirable to make the thickness of the insulating film TIF smaller than that of the insulating film BIF. On the other hand, when writing or erasing is performed according to the FN system (i.e., in the case of the operation system B, C, or D) and when charges are tunneled from the semiconductor substrate 1S and injected into the charge storage film ECF, it is desirable to make the thickness of the insulating film BIF smaller than that of the insulating film TIF. Additionally, when writing is performed according to the SSI system and erasing is performed according to the BTBT system (i.e., in the case of the operation system A), it is desirable to make the thickness of the insulating film TIF larger than or equal to that of the insulating film BIF.

When reading is performed, for example, the voltages listed in the "Reading Operation Voltage" in the A column, the B column, the C column, or the D column of the table illustrated in FIG. 4 are applied to the respective parts of the selected memory cell in which reading is performed. A write state and an erasing state can be distinguished from each other by setting the voltage Vmg to be applied to the memory gate electrode MG, occurring when reading is performed, to be a value between the threshold voltage of the memory transistor in a write state and the threshold voltage thereof in an erasing state.

Characteristics in First Embodiment

Subsequently, characteristic points in First Embodiment will be described. A characteristic point in First Embodiment is that the offset spacer OS1 formed in the memory cell MC1 and the offset spacer OS2 formed in the MISFET Q1 are formed by materials different from each other, for example, as illustrated in FIG. 2.

Specifically, the offset spacer OS1 formed in the memory cell MC1 is formed by a laminated film of the silicon oxide film OXF1 and the silicon nitride film SNF1, and in particular, the silicon oxide film OXF1 is formed to directly contact both the sidewall of the memory gate electrode MG and the side end portion of the charge storage film ECF, as illustrated in FIG. 2. On the other hand, the offset spacer OS2 formed in the MISFET Q1 is formed by the silicon nitride film SNF1. Particularly in the MISFET Q1, the silicon nitride film SNF1 directly contacts both the sidewall of the gate electrode G1 and the side end portion of the high dielectric constant film HK.

Thereby, the effect described below can be obtained. That is, the silicon oxide film OXF1 is formed to directly contact both the sidewall of the memory gate electrode MG and the side end portion of the charge storage film ECF in the memory cell MC1. In other words, the silicon nitride film SNF1 is not formed to directly contact the side end portion of the charge storage film ECF.

Herein, if the silicon nitride film directly contacts, for example, the side end portion of the charge storage film ECF, there is the possibility that, because the silicon nitride film has a charge storage function, the hot electrons, generated when a writing operation is performed, may be trapped in the vicinity of the end portion of the memory gate electrode MG by the silicon nitride film. And, while writing operations are being repeated, electrons are further stored in the silicon nitride film, which creates the concern that the threshold voltage in the vicinity of the end portion of the memory gate electrode MG may be increased. Such an increase in the threshold voltage will cause both degradation of a transconductance (gm), which is a ratio of a change in a drain current to a change in a gate voltage, and a decrease in a read-out current. That is, if the silicon nitride film directly contacts the side end portion of the charge storage film ECF, there is the fear that unintended charges may be stored in the silicon nitride film, thereby possibly causing a decrease in the performance of the non-volatile memory.

On the other hand, in First Embodiment, the silicon oxide film OXF1, not a silicon nitride film, is formed to directly contact both the sidewall of the memory gate electrode MG and the side end portion of the charge storage film ECF. In this case, the silicon oxide film OXF1 does not have a charge storage function as shown by a silicon nitride film, and hence an increase in the threshold voltage in the vicinity of the end portion of the memory gate electrode MG, resulting from the storage of charges, can be suppressed. Therefore, according to the non-volatile memory in First Embodiment, degradation of a transconductance (gm), which is a ratio of a change in a drain current to a change in a gate voltage, and a decrease in a read-out current can be suppressed. As a result, the performance of the non-volatile memory can be improved.

On the other hand, in the MISFET Q1, the silicon nitride film SNF1 is formed to directly contact both the sidewall of the gate electrode G1 and the side end portion of the high dielectric constant film HK. In other words, the silicon oxide film OXF1 is not formed to directly contact the side end portion of the high dielectric constant film HK. That is, the silicon nitride film SNF1 is formed to directly contact the side end portion of the high dielectric constant film HK, in the HKMG-MISFET (MISFET Q1.)

Herein, if a silicon oxide film is used for the offset spacer in the HKMG-MISFET, there is the fear that oxygen, resulting from the silicon oxide film that forms the offset spacer, may enter a gate insulating film due to a heat treatment for impurity activation, or the like, thereby possibly causing variations in the characteristics of the gate insulating film. In particular, in an HKMG-MISFET using the high dielectric constant film HK containing a metal compound in a gate insulating film, there is the concern that variations in the characteristics of the gate insulating film, resulting from the entry of oxygen from the offset spacer into the gate insulating film, may be revealed.

With respect to this point, the offset spacer OS2 in the HKMG-MISFET (MISFET Q1, low withstand voltage MISFET) is formed by the silicon nitride film SNF1 in First Embodiment, as illustrated in FIG. 2. That is, the silicon nitride film SNF1 is formed to directly contact the side end portion of the high dielectric constant film HK in the HKMG-MISFET. Thereby, the silicon oxide film does not directly contact the side end portion of the high dielectric constant film HK according to First Embodiment, and hence the entry of oxygen from the offset spacer OS2 into the high dielectric constant film HK can be suppressed, and as a result, variations in the characteristics of the high dielectric constant film HK, resulting from the entry of oxygen thereinto, can be suppressed. Therefore, according to First Embodiment, the performance of the HKMG-MISFET can be improved.

From the facts mentioned above, the silicon oxide film OXF1 is formed to directly contact the side end portion of the charge storage film ECF in the memory cell MC1, and the silicon nitride film SNF1 is formed to directly contact the side end portion of the high dielectric constant film HK containing a metal compound in the HKMG-MISFET, in First Embodiment. As a result, the performance of each of the non-volatile memory and the HKMG-MISFET can be improved according to First Embodiment.

Manufacturing Method of Semiconductor Device (Gate Last+HK First)

Figure 5:
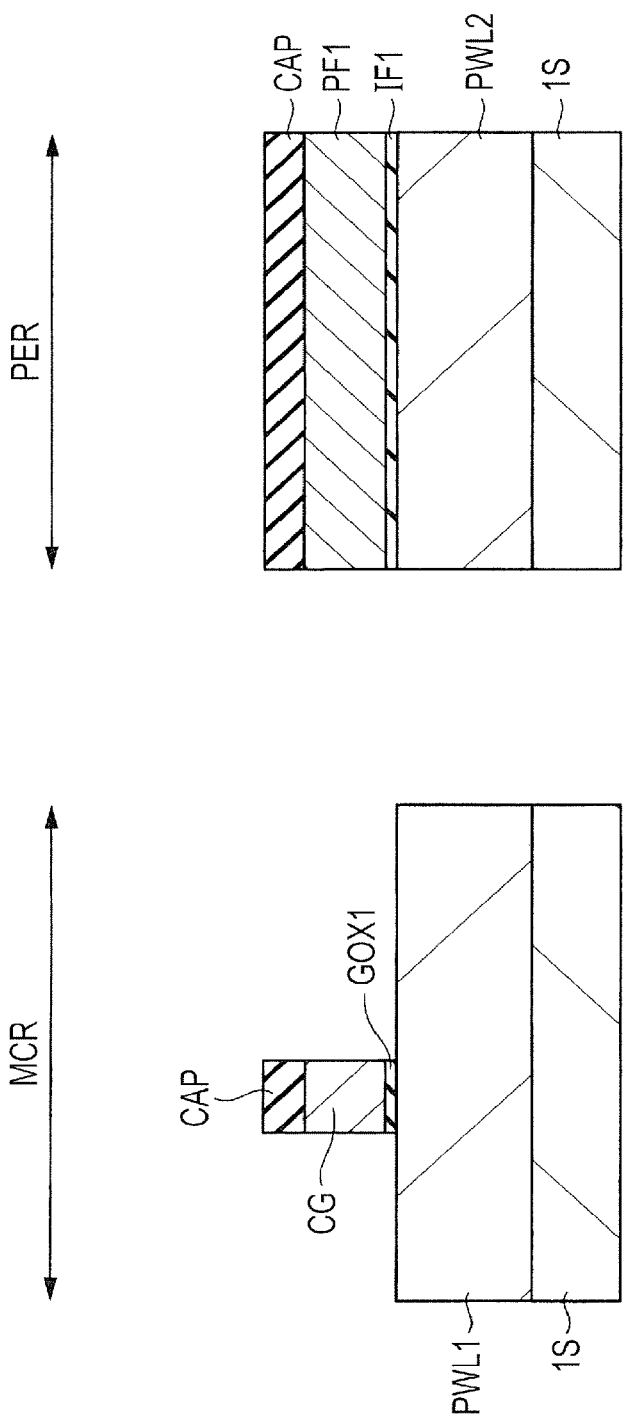
FIG. 5 is a sectional view illustrating a manufacturing step of the semiconductor device in First Embodiment.

Subsequently, a manufacturing method of a semiconductor device in First Embodiment will be described. An element isolation region (not illustrated) is first formed over the semiconductor substrate 1S. Then, the p-type well PWL1 is formed over the semiconductor substrate 1S in the memory cell formation region MCR and the p-type well PWL2 is formed over the semiconductor substrate 1S in the peripheral circuit formation region PER, by a photolithography technique and an ion injection process. Subsequently, after channel injection is performed, the gate insulating film GOX1 is formed in the memory cell formation region MCR over the semiconductor substrate 1S, and the insulating film IF1 is formed in the peripheral circuit formation region PER over the semiconductor substrate 1S. The gate insulating film GOX1 and the insulating film IF1 can be formed, for example, by a silicon oxide film. Subsequently, a polysilicon film PF1 is formed over the whole main surface of the semiconductor substrate 1S, and a cap insulating film CAP including, for example, a silicon nitride film is formed over the polysilicon film PF1. The control gate electrode CG is then formed in the memory cell formation region MCR by using a photolithography technique and a dry etching technique (see FIG. 5.)

Figure 6:
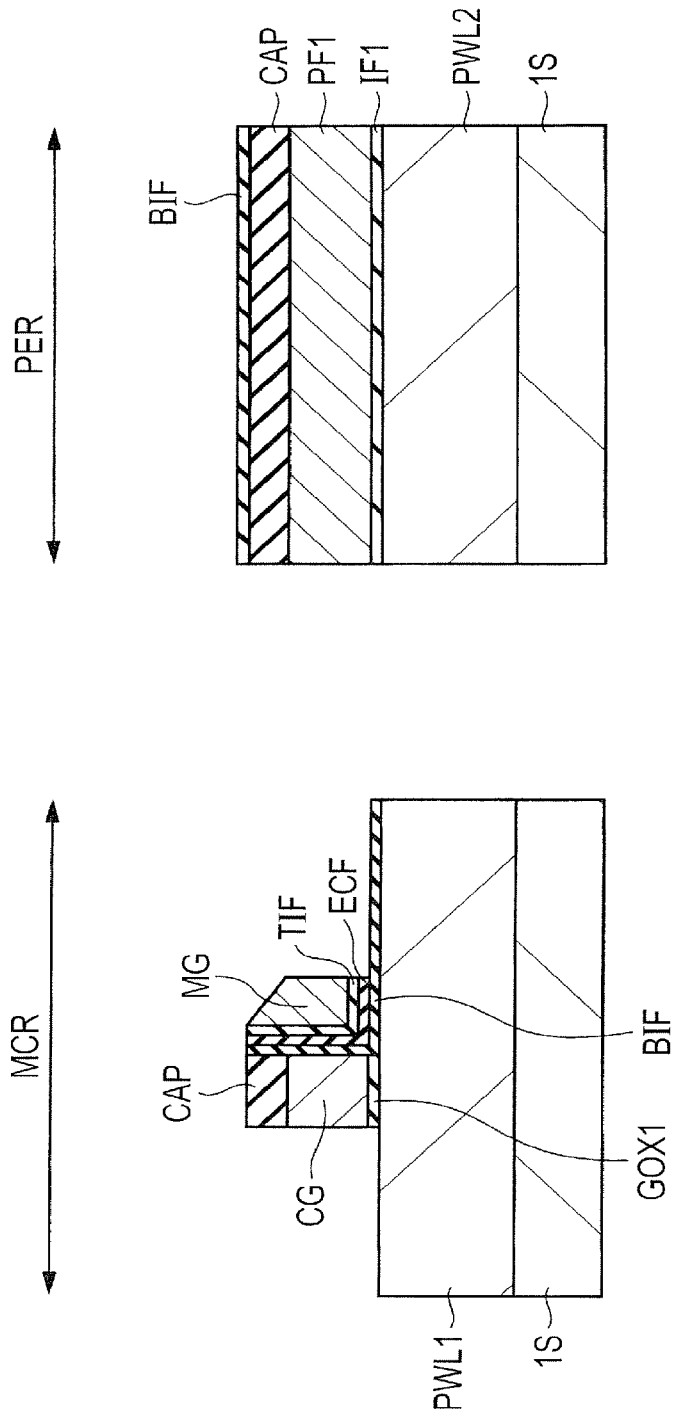
FIG. 6 is a sectional view illustrating a manufacturing step of the semiconductor device, following FIG. 5.

Subsequently, a laminated insulating film is formed over the semiconductor substrate 1S. The laminated insulating film is formed by: the insulating film BIF including, for example, a silicon oxide film; the charge storage film ECF formed over the insulating film BIF and including a silicon nitride film; and the insulating film TIF formed over the charge storage film ECF and including a silicon oxide film or a silicon oxynitride film. The laminated insulating film can be considered as an ONO film. Thereafter, a polysilicon film is formed over the semiconductor substrate 1S. The polysilicon film is then processed to have a sidewall-like shape by anisotropic dry etching. At the time, the polysilicon film formed in the peripheral circuit formation region PER is removed. Subsequently, the polysilicon film having a sidewall-like shape, located near to the drain, is removed by a photolithography technique, in a state where the polysilicon film having a sidewall-like shape, located near to the source, is protected. Thereby, the memory gate electrode MG including the polysilicon film having a sidewall-like shape, located near to the source, is formed. Thereafter, both the insulating film TIF in the upper layer of the ONO film exposed from the memory gate electrode MG and the charge storage film ECF in the intermediate layer of the ONO film are removed by wet etching. At the time, the insulating film BIF in the lower layer of the ONO film remains slightly over the cap insulating film CAP in the peripheral circuit formation region PER (see FIG. 6.)

Figure 7:
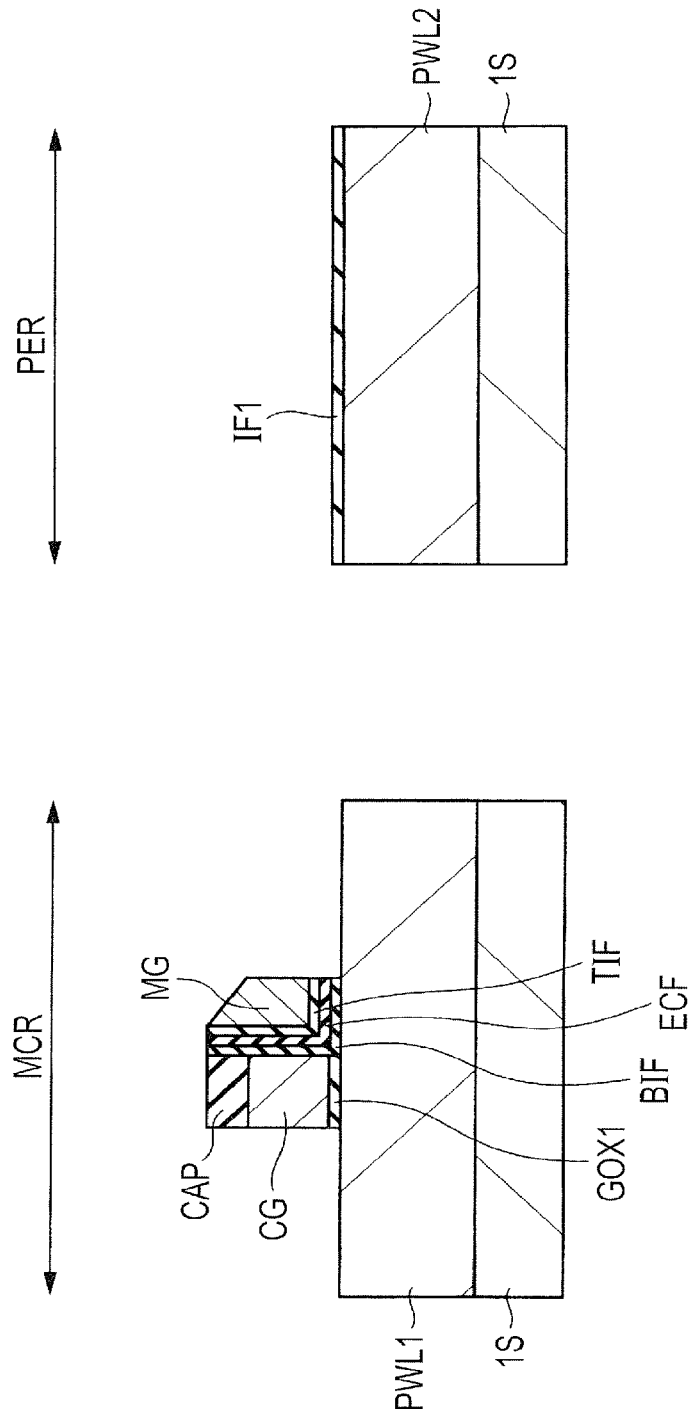
FIG. 7 is a sectional view illustrating a manufacturing step of the semiconductor device, following FIG. 6.

Subsequently, the insulating film BIF formed in the peripheral circuit formation region PER, the cap insulating film CAP, and the polysilicon film PF1, the latter two being formed below the insulating film BIF, are removed by a photolithography technique and a dry etching technique (see FIG. 7.) At the time, the exposed insulating film BIF is removed also in the memory cell formation region MCR.

Figure 8:
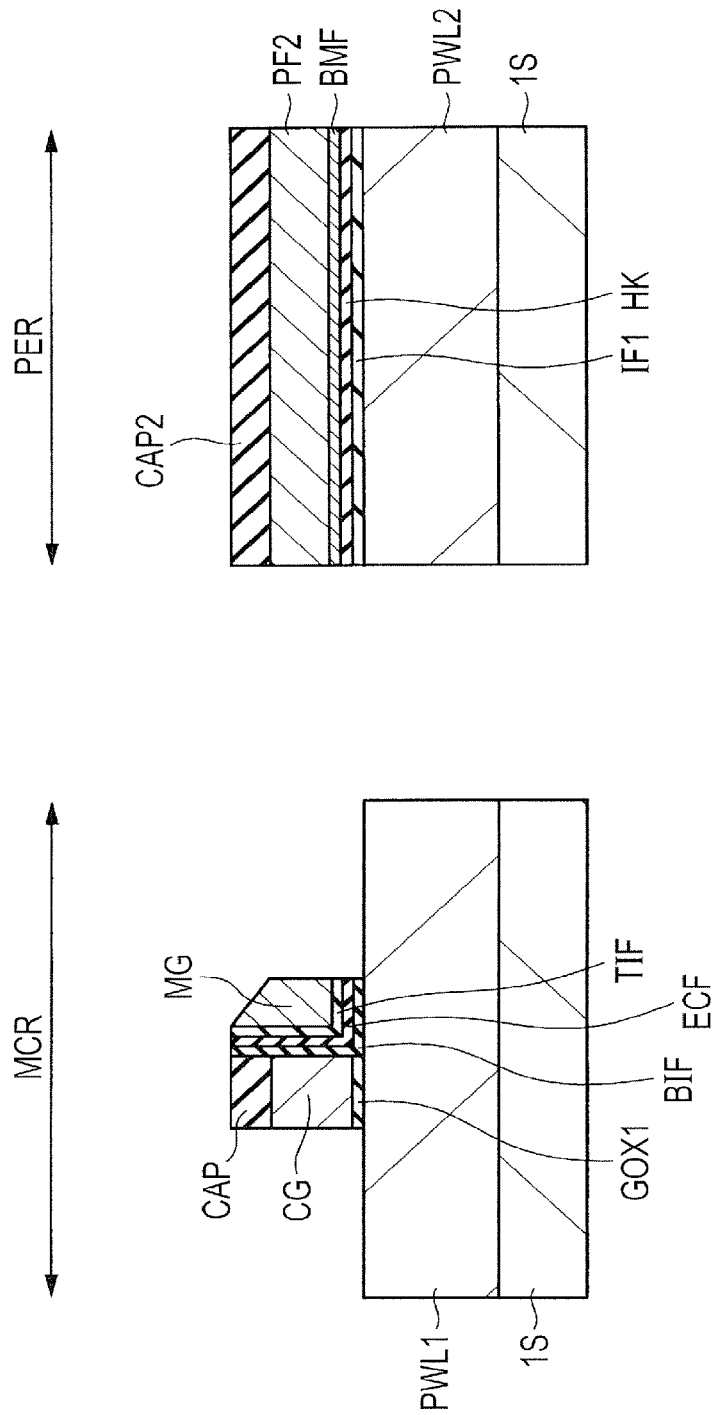
FIG. 8 is a sectional view illustrating a manufacturing step of the semiconductor device, following FIG. 7.

Subsequently, a cap insulating film CAP2 including the high dielectric constant film HK, the barrier metal film BMF, a polysilicon film PF2, and a silicon nitride film is formed over the whole surface of the semiconductor substrate 1S. Herein, the high dielectric constant film HK may be formed after the insulating film IF1 is once removed by fluoric acid (HF), or the like, and after an interface layer including a new silicon oxide film is formed again. Subsequently, the cap insulating film CAP2 including the high dielectric constant film HK, the barrier metal film BMF, the polysilicon film PF2, and the silicon nitride film, the cap insulating film CAP2 being formed in the memory cell formation region MCR, is completely removed by a photolithography technique and a dry etching technique (see FIG. 8.)

Figure 9:
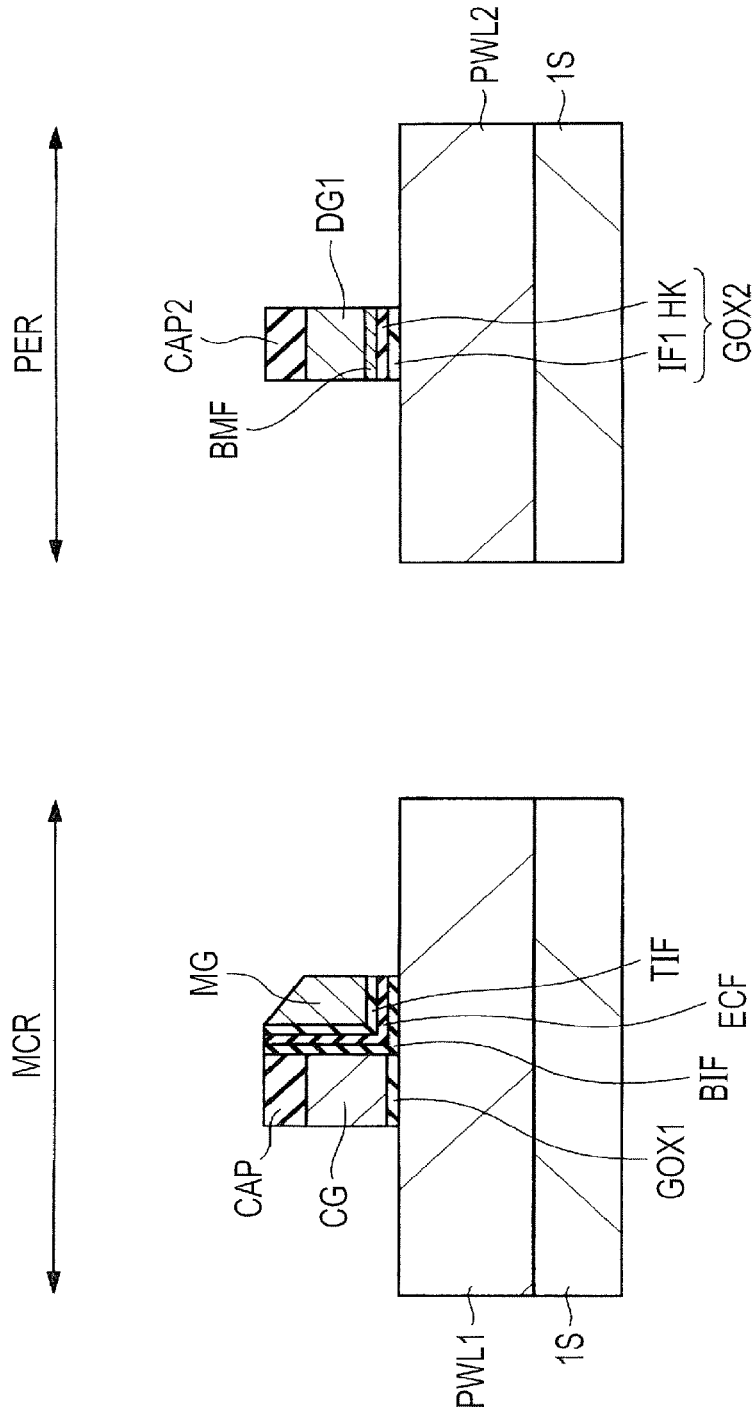
FIG. 9 is a sectional view illustrating a manufacturing step of the semiconductor device, following FIG. 8.

Thereafter, a dummy gate electrode DG1 and the gate insulating film GOX2 including the insulating film IF1 and the high dielectric constant film HK are formed in the peripheral circuit formation region PER by patterning with the use of a photolithography technique and a dry etching technique (see FIG. 9.)

Figure 10:
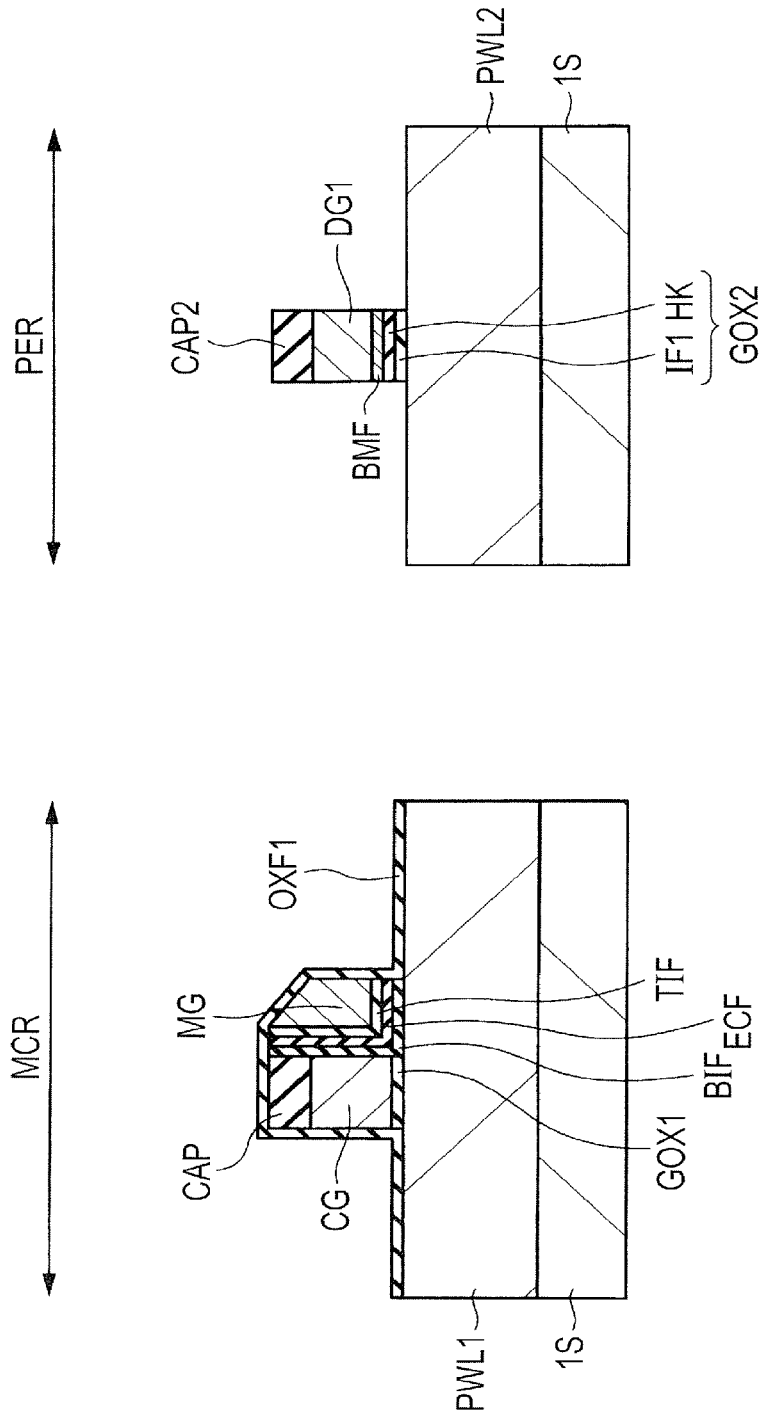
FIG. 10 is a sectional view illustrating a manufacturing step of the semiconductor device, following FIG. 9.

Subsequently, the silicon oxide film OXF1 is formed over the semiconductor substrate 1S, which is then caused to remain only in the memory cell formation region MCR by a photolithography technique and wet etching, thereby allowing the silicon oxide film OXF1, covering the control gate electrode CG and the memory gate electrode MG, to be formed (see FIG. 10.) At the time, the silicon oxide film OXF1 formed in the peripheral circuit formation region PER is removed.

Figure 11:
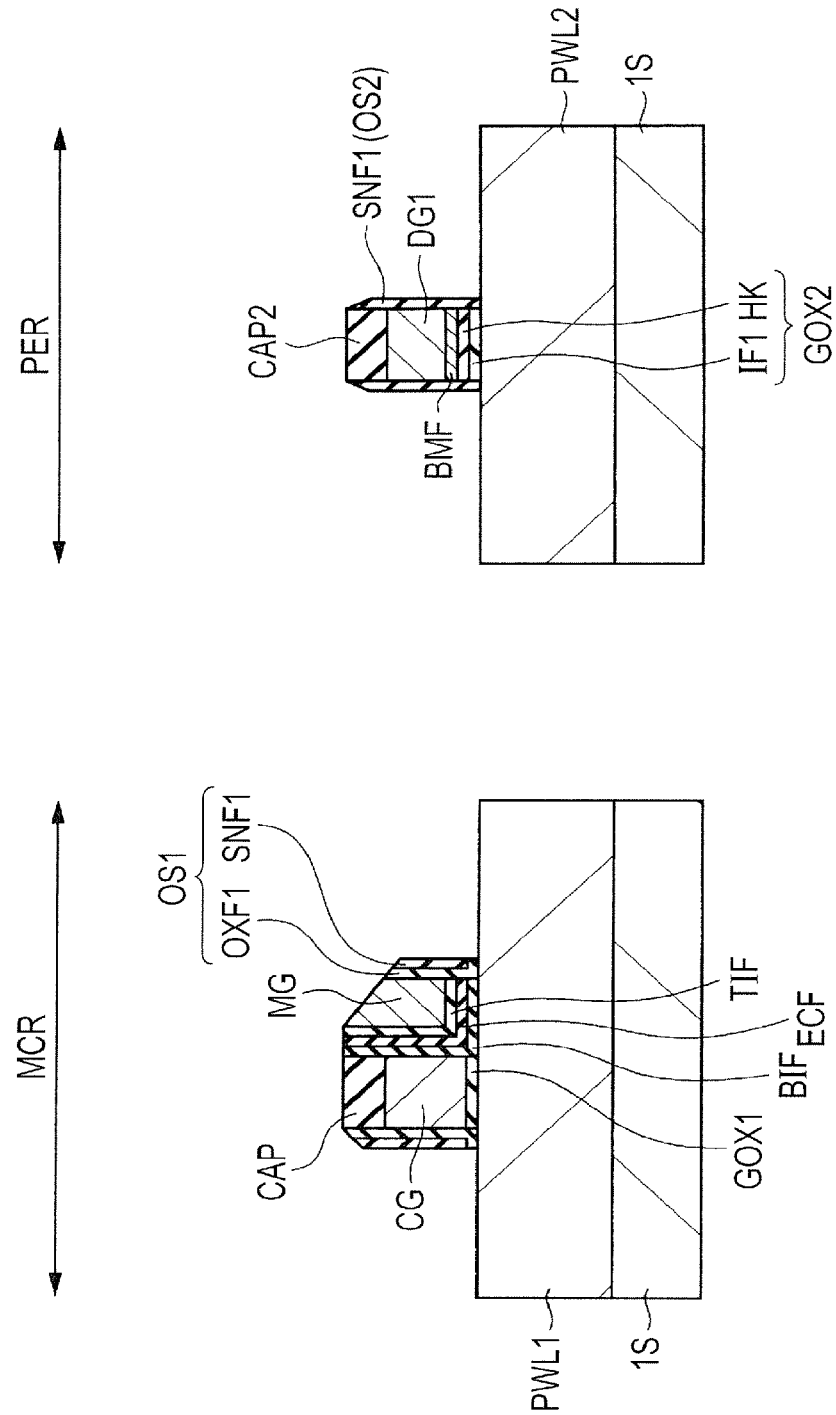
FIG. 11 is a sectional view illustrating a manufacturing step of the semiconductor device, following FIG. 10.

Subsequently, after the silicon nitride film SNF1 is formed over the semiconductor substrate 1S, the silicon nitride film SNF1 is etched back by anisotropic dry etching. Thereby, the offset spacer OS1 including the silicon oxide film OXF1 and the silicon nitride film SNF1 is formed near to the drain of the control gate electrode CG and near to the source of the memory gate electrode MG, and the offset spacer OS2 including the silicon nitride film SNF1 is formed over the sidewalls on both the sides of the dummy gate electrode DG1 formed in the peripheral circuit formation region PER (see FIG. 11.)

An example of performing etch-back of the silicon nitride film SNF1 has been described above, but it is also possible that, without performing etch-back, ions are injected via this silicon nitride film SNF1 when the later-described low-concentration impurity diffusion region (extension region) is formed.

As described above, the offset spacer OS2 formed in the peripheral circuit formation region PER is formed by a single layer structure of the silicon nitride film SNF1, while the offset spacer OS1 formed in the memory cell formation region MCR is formed by a laminated structure in which a silicon nitride film is laminated over a silicon oxide film. In this case, the silicon nitride film SNF1 is formed over the silicon oxide film OXF1 in the offset spacer OS1 formed in the memory cell formation region MCR, but the offset spacer OS1 may be formed by a single layer structure of the silicon oxide film OXF1 with the silicon nitride film SNF1 removed. In this case, however, a mask for removing the silicon nitride film SNF1 is required.

Figure 12:
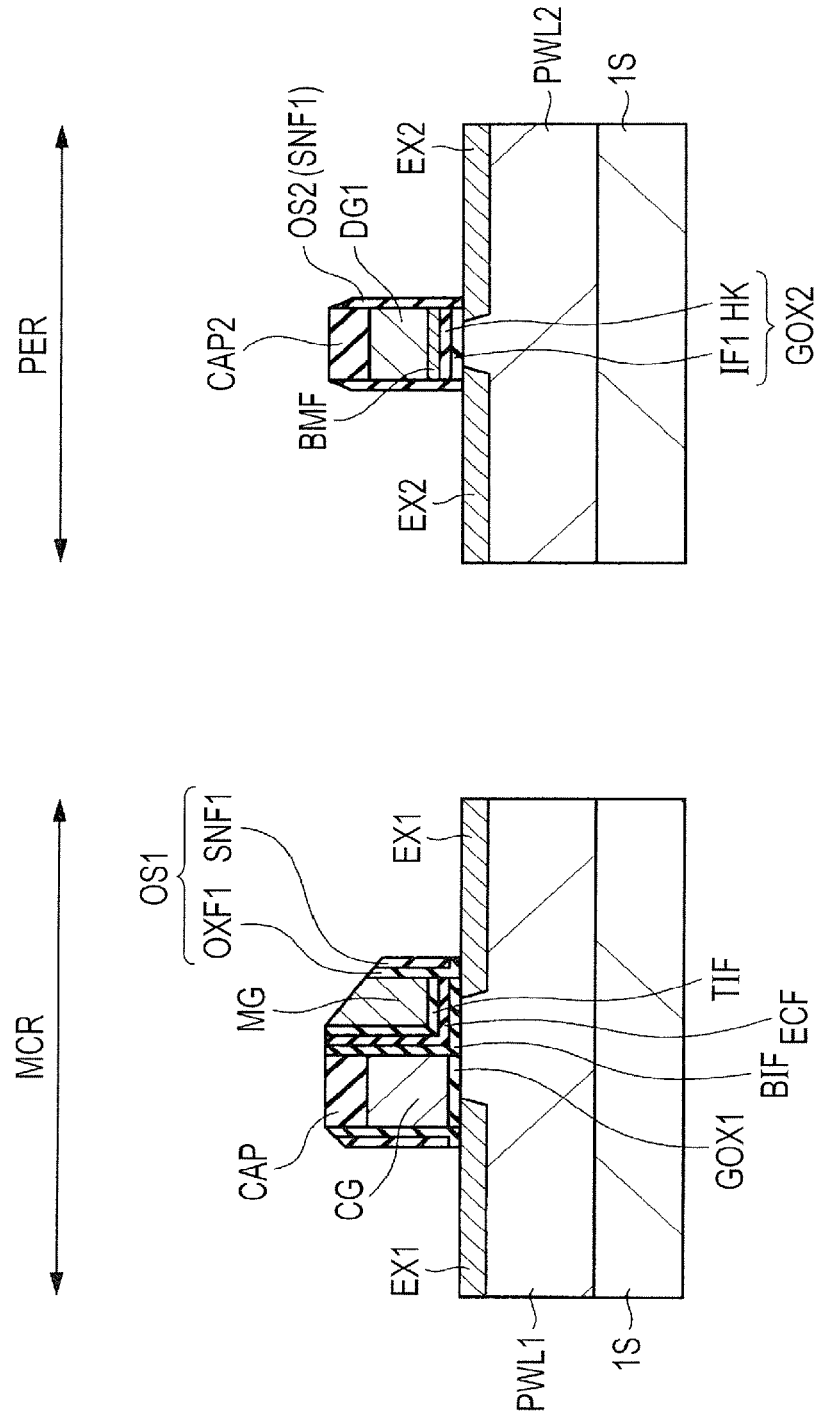
FIG. 12 is a sectional view illustrating a manufacturing step of the semiconductor device, following FIG. 11.

Subsequently, the low-concentration impurity diffusion region EX1 is formed in the memory cell formation region MCR and the low-concentration impurity diffusion region EX2 is formed in the peripheral circuit formation region PER, by using a photolithography technique and an ion injection process (see FIG. 12.) Herein, the injection profile of the low-concentration impurity diffusion region EX1 formed in the memory cell formation region MCR may be different from that of the low-concentration impurity diffusion region EX2 formed in the peripheral circuit formation region PER. Further, the injection profile of the low-concentration impurity diffusion region EX1 located near to the drain and that of the same region EX1 located near to the source, the region EX1 being formed in the memory cell formation region MCR, may be different from each other. Furthermore, a pocket injection region or a halo injection region may be formed to surround each of the low-concentration impurity diffusion regions EX1 and EX2 in order to suppress a short channel effect.

Figure 13:
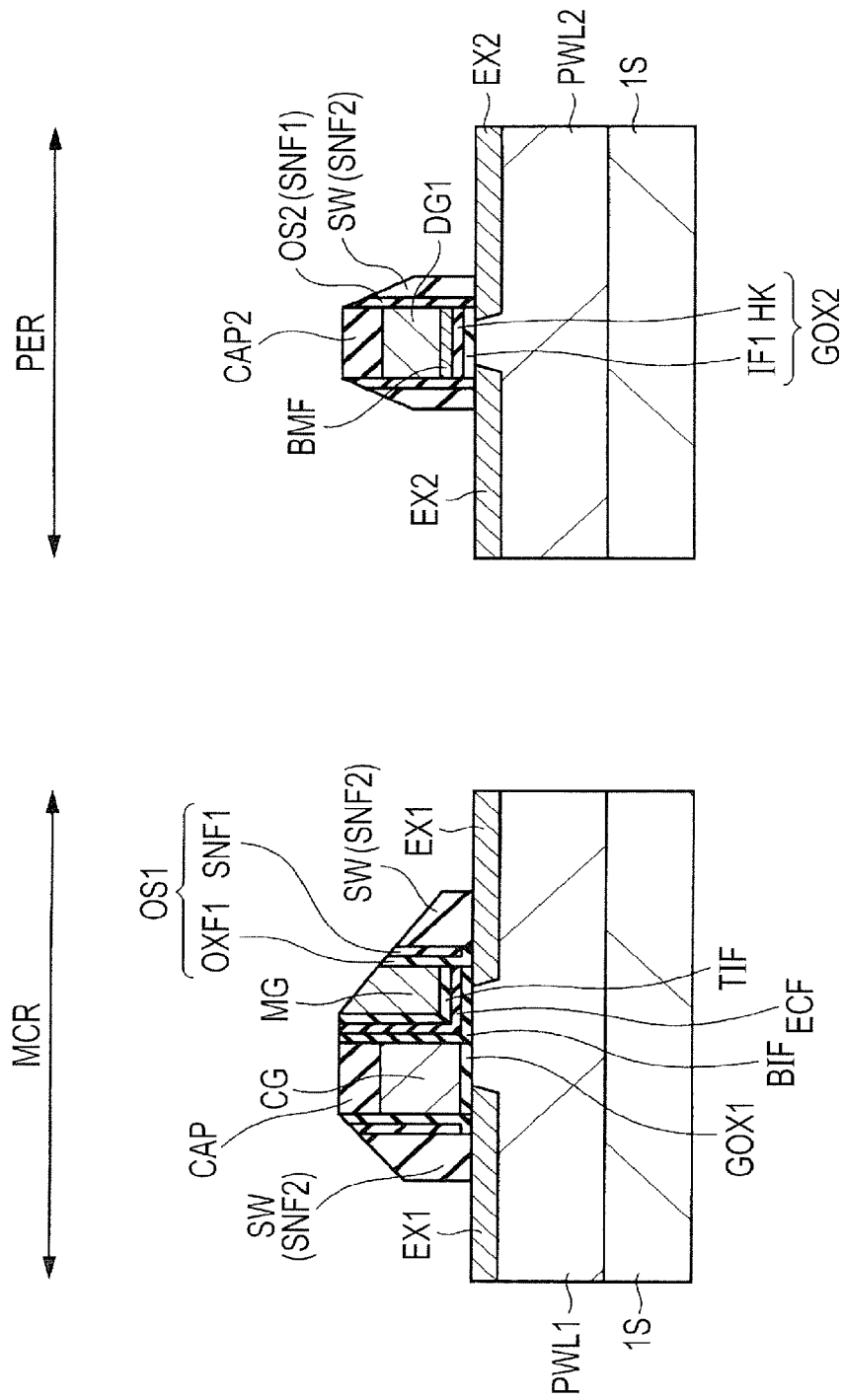
FIG. 13 is a sectional view illustrating a manufacturing step of the semiconductor device, following FIG. 12.

Subsequently, the silicon nitride film SNF2 is formed over the semiconductor substrate 1S, and the sidewall spacer SW is formed by performing etch-back with the use of anisotropic etching (FIG. 13.) Herein, for example, the sidewall SW to be formed in the memory cell formation region MCR is formed such that the width thereof is wide, while the sidewall SW to be formed in the peripheral circuit formation region PER is formed such that the width thereof is narrow.

Figure 14:
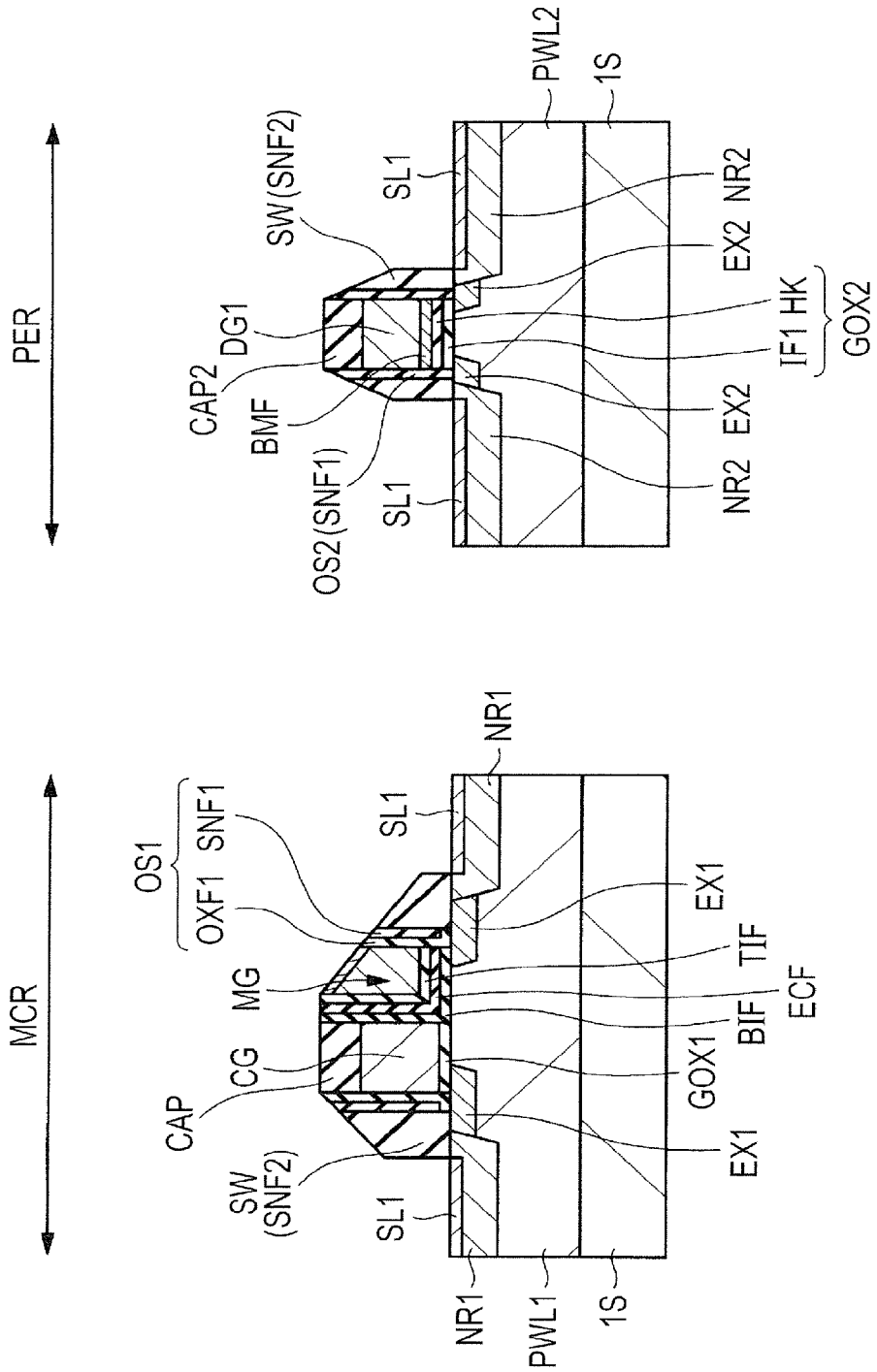
FIG. 14 is a sectional view illustrating a manufacturing step of the semiconductor device, following FIG. 13.

Subsequently, the high-concentration impurity diffusion region NR1 is formed in the memory cell formation region MCR and the high-concentration impurity diffusion region NR2 is formed in the peripheral circuit formation region PER, by a photolithography technique and an ion injection process. Herein, the injection profile of the high-concentration impurity diffusion region NR1 formed in the memory cell formation region MCR may be different from that of the high-concentration impurity diffusion region NR2 formed in the peripheral circuit formation region PER. Thereafter, high-temperature and short-time annealing for impurity activation is performed. Subsequently, a metal silicide film (silicide film SL1) is formed over the semiconductor substrate 1S. At the time, the silicide film SL1 is formed also over the memory gate electrode MG (see FIG. 14.) The silicide film SL1 can be, for example, a cobalt silicide film, a nickel silicide film, or a nickel-platinum silicide film.

Figure 15:
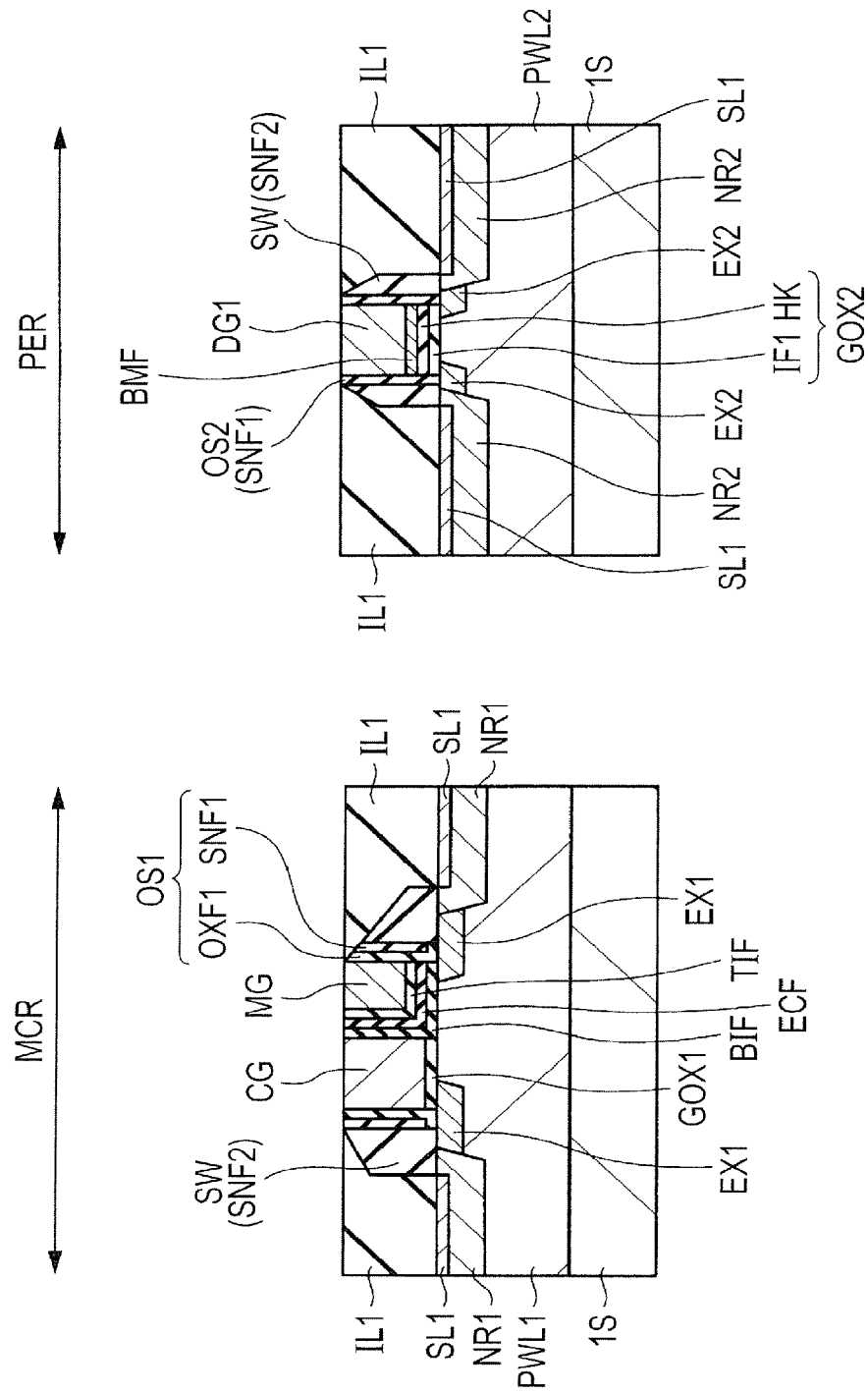
FIG. 15 is a sectional view illustrating a manufacturing step of the semiconductor device, following FIG. 14.

Subsequently, after a silicon nitride film (not illustrated), serving as an etching stopper while a contact hole is being processed, and the interlayer insulating film (silicon oxide film) IL1 are formed over the semiconductor substrate 1S, the dummy gate electrode DG1 in the peripheral circuit formation region PER is exposed by flattening with the use of a CMP process (FIG. 15.) At the time, the control gate electrode CG and the memory gate electrode MG in the memory cell formation region MCR are polished simultaneously. Herein, the silicide film SL1 formed over the upper surface of the memory gate electrode MG may be polished.

Figure 16:
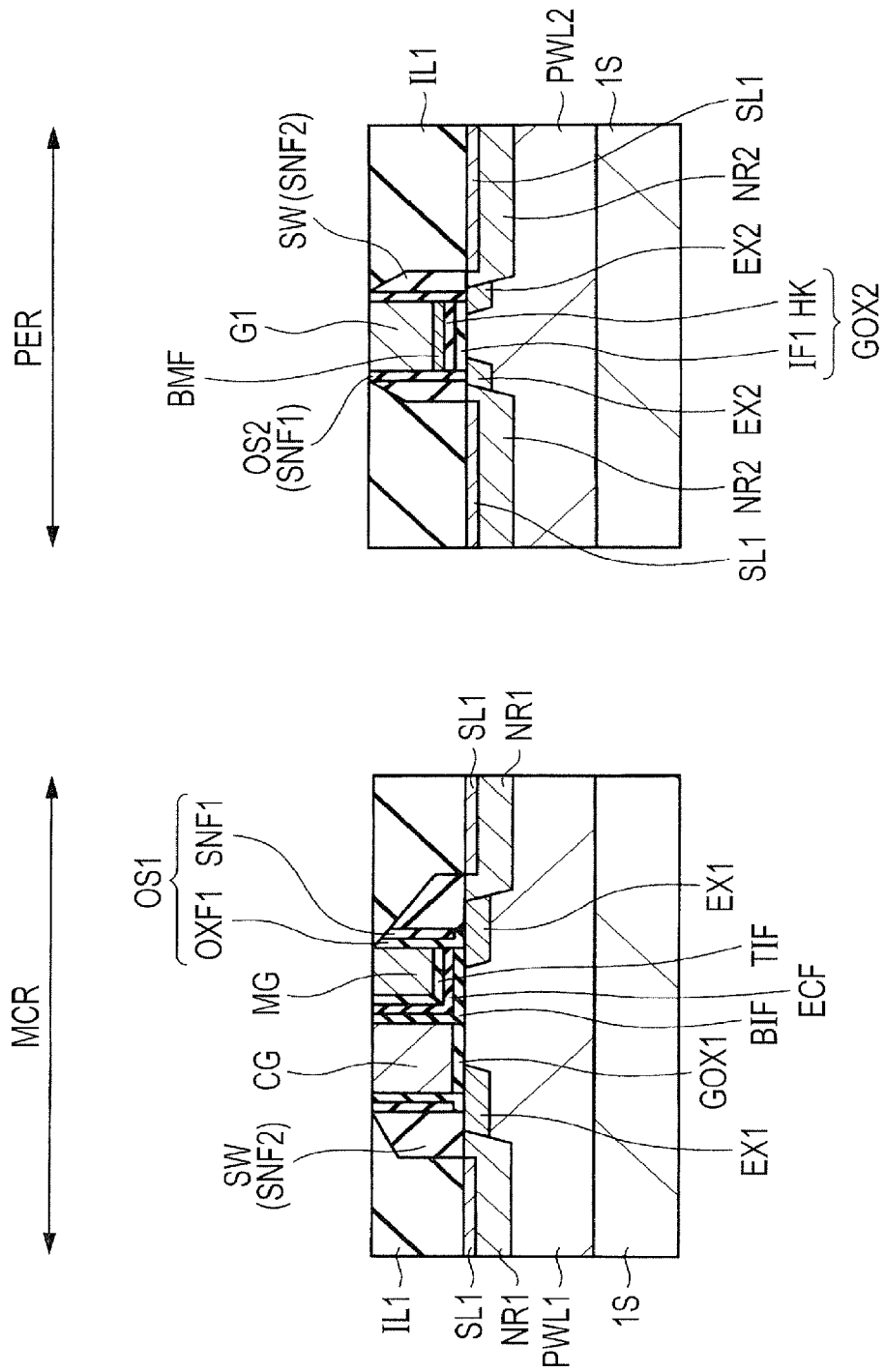
FIG. 16 is a sectional view illustrating a manufacturing step of the semiconductor device, following FIG. 15.

Subsequently, a protective film including, for example, a silicon oxide film is formed over the semiconductor substrate 1S. Then, the protective film formed in the peripheral circuit formation region PER is removed by a photolithography technique and a dry etching technique. Then, the dummy gate electrode DG1 formed in the peripheral circuit formation region is removed by using the protective film formed in the memory cell formation region MCR as a mask. Thereafter, a metal film for work function adjustment (not illustrated) and a low-resistance metal film, such as, for example, an aluminum film, are embedded in a trench portion formed by removing the dummy gate electrode DG1, and flattening is then performed by a CMP process. Thereby, the metal film is caused to remain only in the trench, which forms the gate electrode (metal gate electrode) G1. At the time, the protective film formed in the memory cell formation region MCR is also polished and removed (see FIG. 16.)

Figure 17:
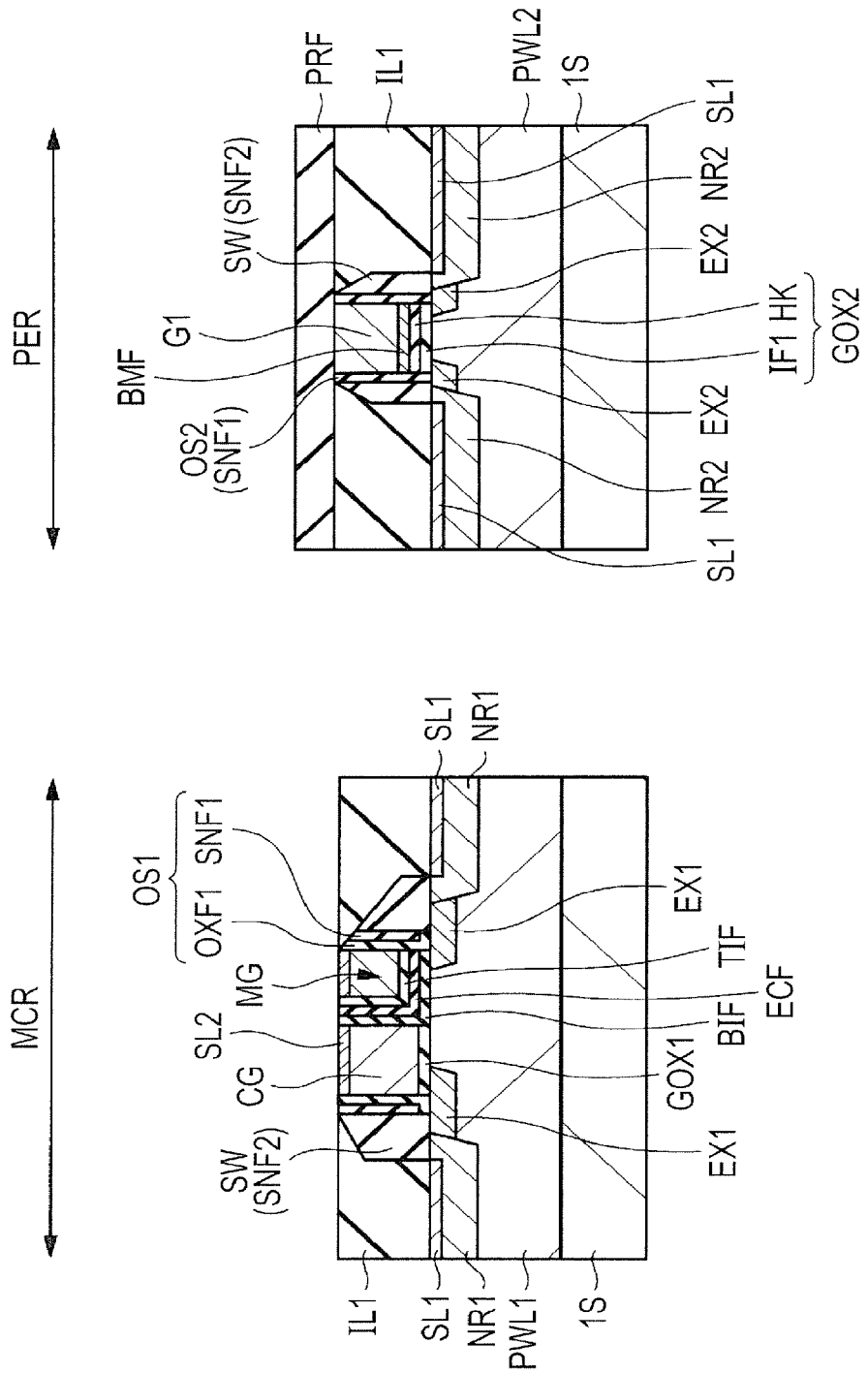
FIG. 17 is a sectional view illustrating a manufacturing step of the semiconductor device, following FIG. 16.

Subsequently, a protective insulating film PRF including, for example, a silicon oxide films is formed over the semiconductor substrate 1S. Then, the protective insulating film PRF formed in the memory cell formation region NCR is removed. Thereby, the upper surfaces of the control gate electrode CG and the memory gate electrode MG are exposed in the memory cell formation region MCR. Thereafter, a silicide film SL2 is formed over the upper surfaces of the control gate electrode CG and the memory gate electrode MG. The silicide film SL2 can be, for example, a cobalt silicide film, a nickel silicide film, or a nickel-platinum silicide film (see FIG. 17.)

Thereafter, the interlayer insulating film IL2 is formed over the semiconductor substrate 1S, and a contact hole, penetrating the interlayer insulating film IL1 and the interlayer insulating film IL2, is then formed by using a photolithography technique and a dry etching technique. Then, the plug PLG1 is formed by embedding a conductor film, such as a tungsten film, in the contact hole. Subsequently, the interlayer insulating film IL3 is formed over the interlayer insulating film IL2 in which the plug PLG1 is formed, and the wiring L1, including copper wiring embedded in the interlayer insulating film IL3, is formed by using a damascene process. The semiconductor device according to First Embodiment can be manufactured in the way described above.

Advantages in First Embodiment

In First Embodiment, the silicon oxide film OXF1 not having a charge storage function is formed to directly contact the side end portion of the charge storage film ECF in the memory cell MC1, while the silicon nitride film SNF1, not serving as a source for supplying oxygen when the later heat treatment is performed, is formed to directly contact the side end portion of the high dielectric constant film HK containing a metal compound in the HKMG-MISFET. Thereby, an increase in the threshold voltage in the vicinity of the end portion of the memory gate electrode MG, resulting from the storage of charges into the offset spacer OS1, can be suppressed in the memory cell MC1. Therefore, according to the non-volatile memory in First Embodiment, degradation of a transconductance (gm), which is a ratio of a change in a drain current to a change in a gate voltage, and a decrease in a read-out current can be suppressed. As a result, the performance of the non-volatile memory can be improved.

On the other hand, in the MISFET Q1, a silicon oxide film serving as a source for supplying oxygen does not directly contact the side end portion of the high dielectric constant film HK, and hence the entry of oxygen from the offset spacer OS2 into the high dielectric constant film HK, occurring due to the later heat treatment, can be suppressed. As a result, variations in the characteristics of the gate insulating film GOX2, resulting from the entry of oxygen into the high dielectric constant film HK, can be suppressed. Therefore, according to First Embodiment, the performance of the HKMG-MISFET can be improved.

According to First Embodiment, the performance of each of the non-volatile memory and the HKMG-MISFET can be improved by forming the offset spacers with materials that are suitable for the memory cell MC1 and the MISFET Q1, respectively, and are different from each other, as described above.

Subsequently, the sidewall spacer SW in the memory cell MC1 and the sidewall spacer SW in the MISFET Q1 are formed by the same silicon nitride film in First Embodiment. In this case, a silicon nitride film having a charge storage function is used for the sidewall spacer SW in the memory cell MC1. An important point herein is that the film directly contacting the charge storage film ECF is formed by the silicon oxide film OXF1 not having a charge storage function, and when this configuration is achieved, it is not a problem that the sidewall spacer SW not directly contacting the charge storage film ECF is formed by a silicon nitride film. It is because: the sidewall spacer SW is located at a position farther from the end portion of the memory gate electrode MG than the offset spacer OS; and it can be considered that the possibility that charges, generated while the memory cell MC1 is operating, may be stored in the sidewall spacer SW becomes lower than the possibility that they may be stored in the offset spacer OS1.

On the other hand, in the MISFET Q1, it is important to form the offset spacer OS2, directly contacting the high dielectric constant film HK, by the silicon nitride film SNF1 not serving as a source for supplying oxygen, and it is desirable to form even the sidewall spacer SW, not directly contacting the high dielectric constant film HK, by a silicon nitride film, not by a silicon oxide film, because there is the fear that the sidewall spacer SW may serve as a source for diffusing oxygen. That is, in the MISFET Q1, unlike the situation in the memory cell MC1, the possibility that oxygen may enter the high dielectric constant film HK, due to diffusion of oxygen, is high even if the sidewall spacer SW does not directly contact the high dielectric constant film HK, and hence it is considered that the sidewall spacer SW should not be formed by a silicon oxide film serving as a source for supplying oxygen. That is, in selecting materials for the offset spacers OS1 and OS2, it is necessary to take into consideration peculiar circumstances of each of the memory cell MC1 and the MISFET Q1; on the other hand, in selecting a material for the sidewall spacer SW, it is necessary to give higher priority to the circumstances of the MISFET Q1 than to those of the memory cell MC1.

In consideration of this, the sidewall spacer SW is formed by the silicon nitride film SNF2 in First Embodiment. In particular, in First Embodiment, the step of forming the sidewall spacer SW can be simplified by forming both the sidewall spacers SW in the memory cells MC1 and the MISFET Q1 with the silicon nitride film SNF2, the same material, thereby allowing the manufacturing cost of a semiconductor device to be reduced.

Second Embodiment

In the aforementioned First Embodiment, the silicon oxide film OXF1 is formed at first in the memory cell formation region MCR, and the silicon nitride film SNF1 is then formed in the peripheral circuit formation region PER. Thereby, the offset spacer OS1 in the memory cell MC1 is formed by both the silicon oxide film OXF1 directly contacting the charge storage film ECF and the silicon nitride film SNF1 over the silicon oxide film OXF1, and the offset spacer OS2 in the MISFET Q1 is formed by the silicon nitride film SNF1, in First Embodiment. On the other hand, an example will be described in Second Embodiment, in which the silicon nitride film SNF1 is formed at first in the peripheral circuit formation region PER, and the silicon oxide film OXF1 is then formed in the memory cell formation region MCR.

Manufacturing Method of Semiconductor Device

Figure 18:
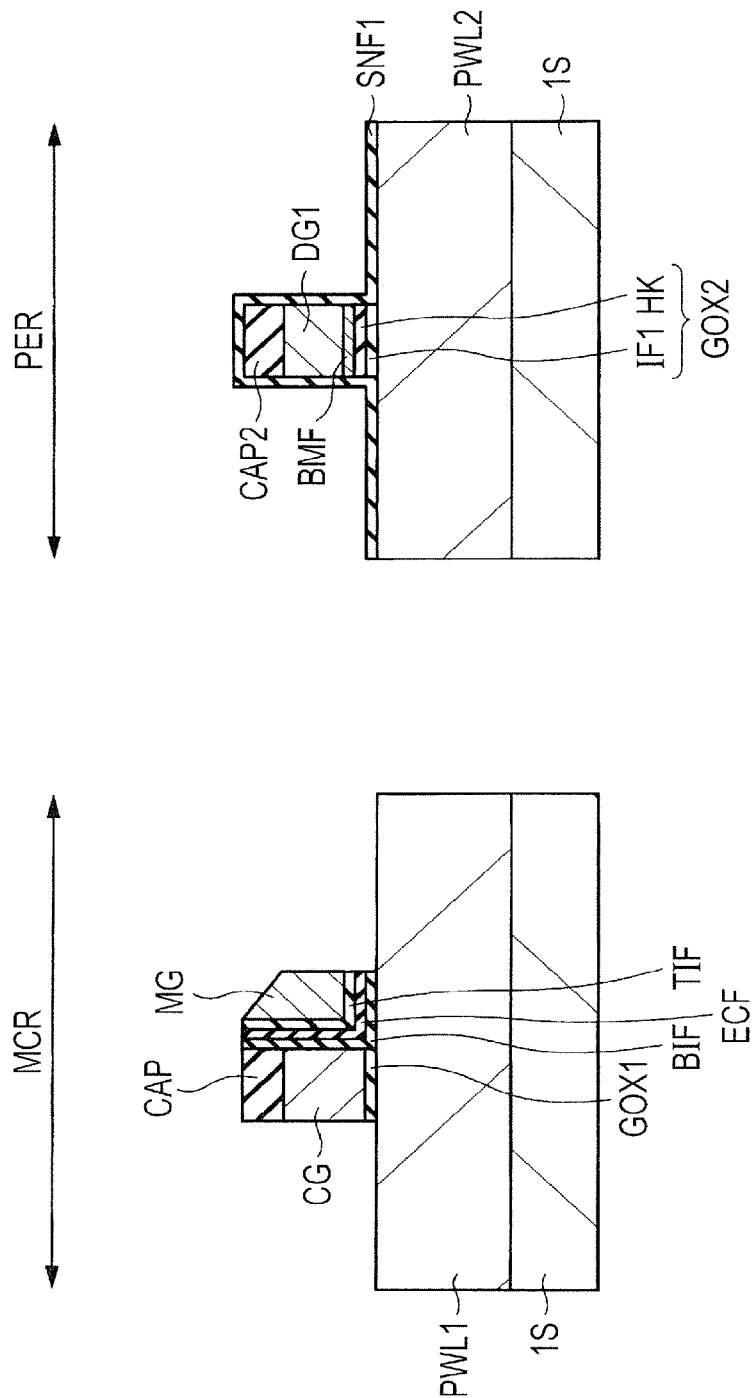
FIG. 18 is a sectional view illustrating a manufacturing step of a semiconductor device in Second Embodiment.

After the dummy gate electrode DG1 is formed in the peripheral circuit formation region PER, the silicon nitride film SNF1 is formed over the semiconductor substrate 1S. Then, the silicon nitride film SNF1 is caused to remain only in the peripheral circuit formation region PER and that present in the memory cell formation region MCR is removed by using a photolithography technique and a dry etching technique (see FIG. 18.)

Figure 19:
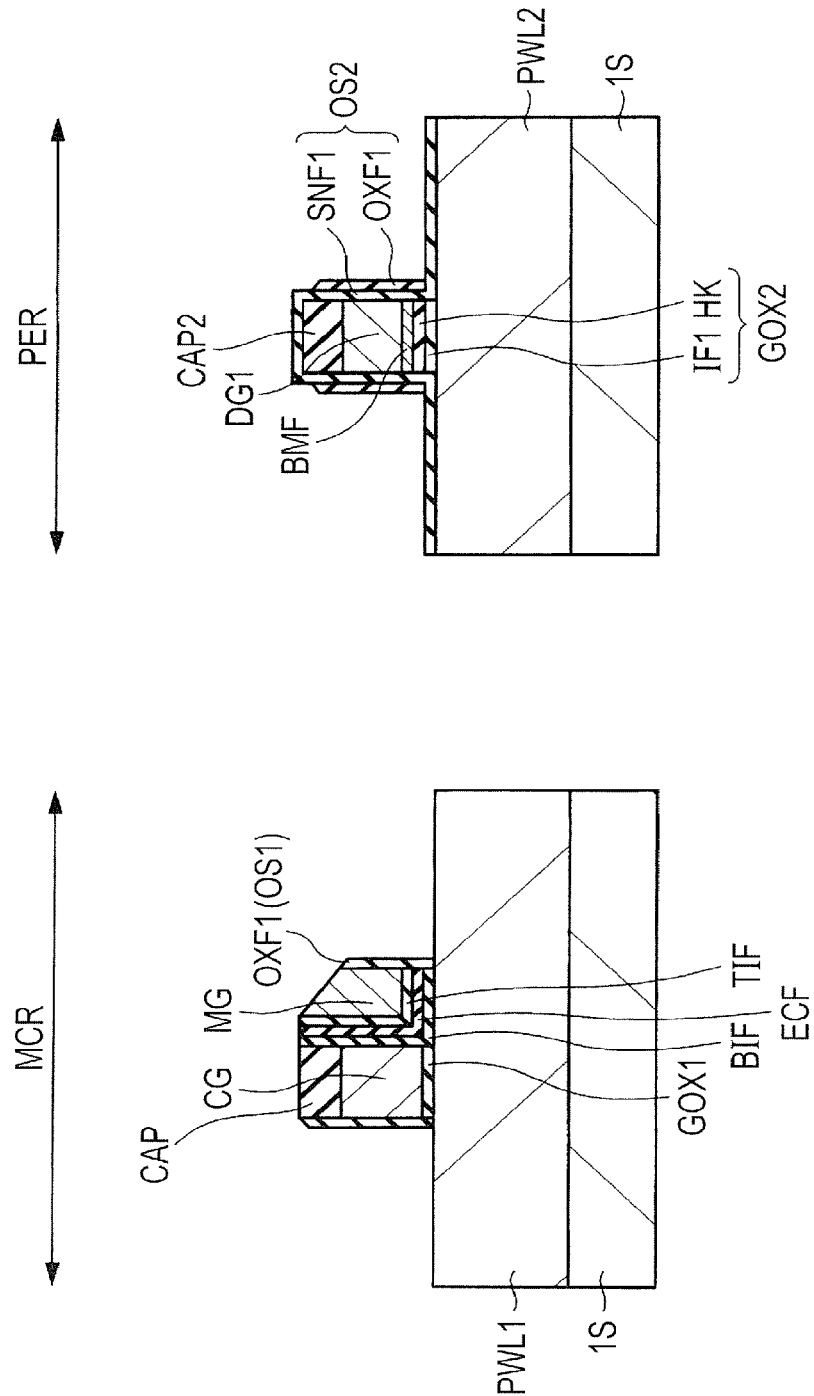
FIG. 19 is a sectional view illustrating a manufacturing step of the semiconductor device, following FIG. 18.

Subsequently, the silicon oxide film OXF1 is formed over the semiconductor substrate 1S, and the offset spacer OS1 including the silicon oxide film OXF1 is then formed over the sidewalls on both the sides of the memory cell MC1 by etching back the silicon oxide film OXF1 with the use of anisotropic dry etching. On the other hand, in the peripheral circuit formation region PER, the offset spacer OS2, including a laminated film of the silicon nitride film SNF1 and the silicon oxide film OXF1, is formed over the sidewalls on both the sides of the dummy gate electrode DG1 (see FIG. 19.) Herein, a step of removing the silicon oxide film OXF1 formed over the sidewalls on both the sides of the dummy gate electrode DG1 may be added, but in this case, it is required to add a mask.

Figure 20:
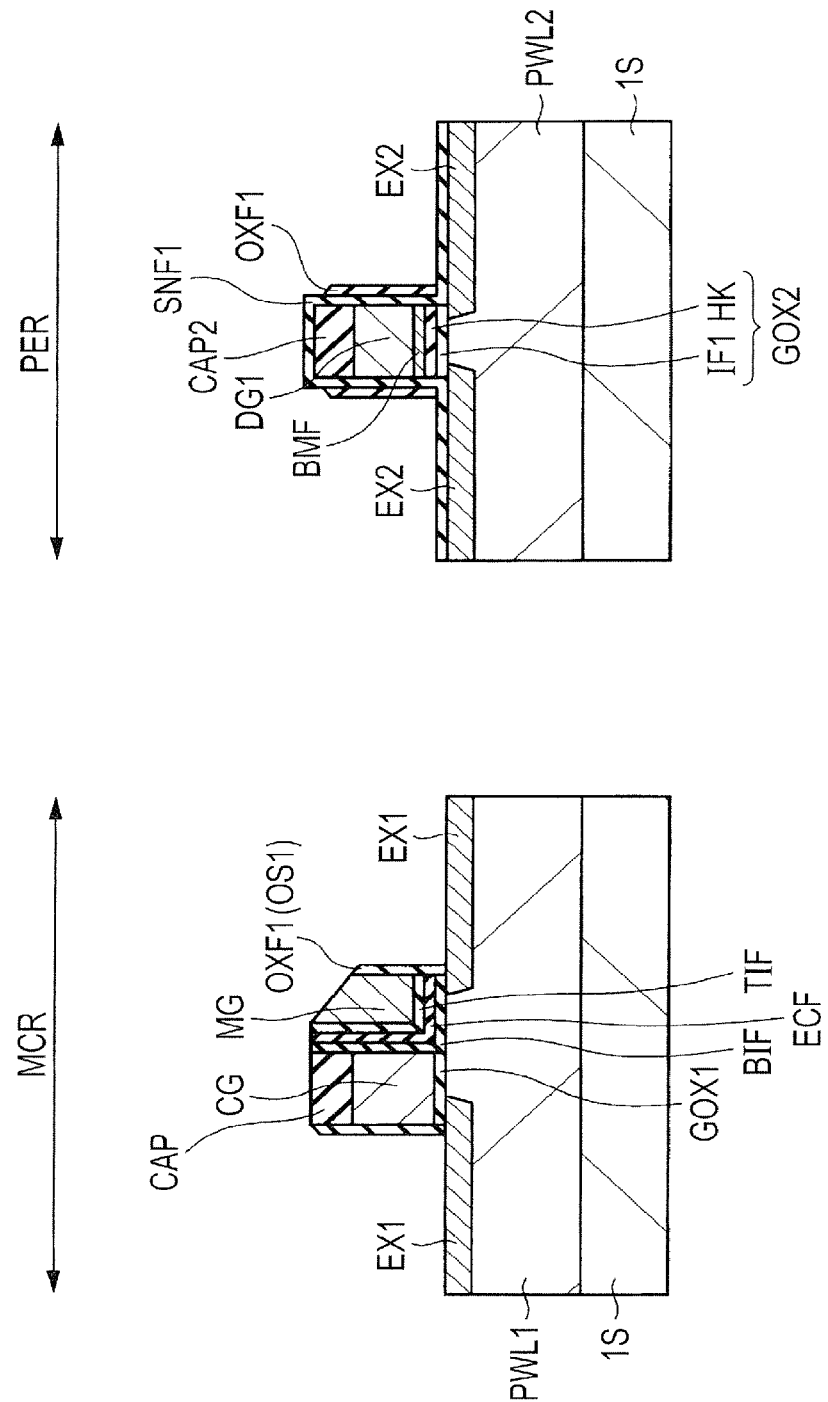
FIG. 20 is a sectional view illustrating a manufacturing step of the semiconductor device, following FIG. 19.

Thereafter, the low-concentration impurity diffusion region EX1 is formed in the memory cell formation region MCR and the low-concentration impurity diffusion region EX2 is formed in the peripheral circuit formation region PER by using a photolithography technique and an ion injection process (see FIG. 20.) Herein, the injection profile of the low-concentration impurity diffusion region EX1 formed in the memory cell formation region MCR may be different from that of the low-concentration impurity diffusion region EX2 formed in the peripheral circuit formation region PER. Further, the injection profile of the low-concentration impurity diffusion region EX1 located near to the drain and that of the same region EX1 located near to the source, the region EX1 being formed in the memory cell formation region MCR, may be different from each other. Furthermore, a pocket injection region or a halo injection region may be formed to surround each of the low-concentration impurity diffusion regions EX1 and EX2 in order to suppress a short channel effect.

Figure 21:
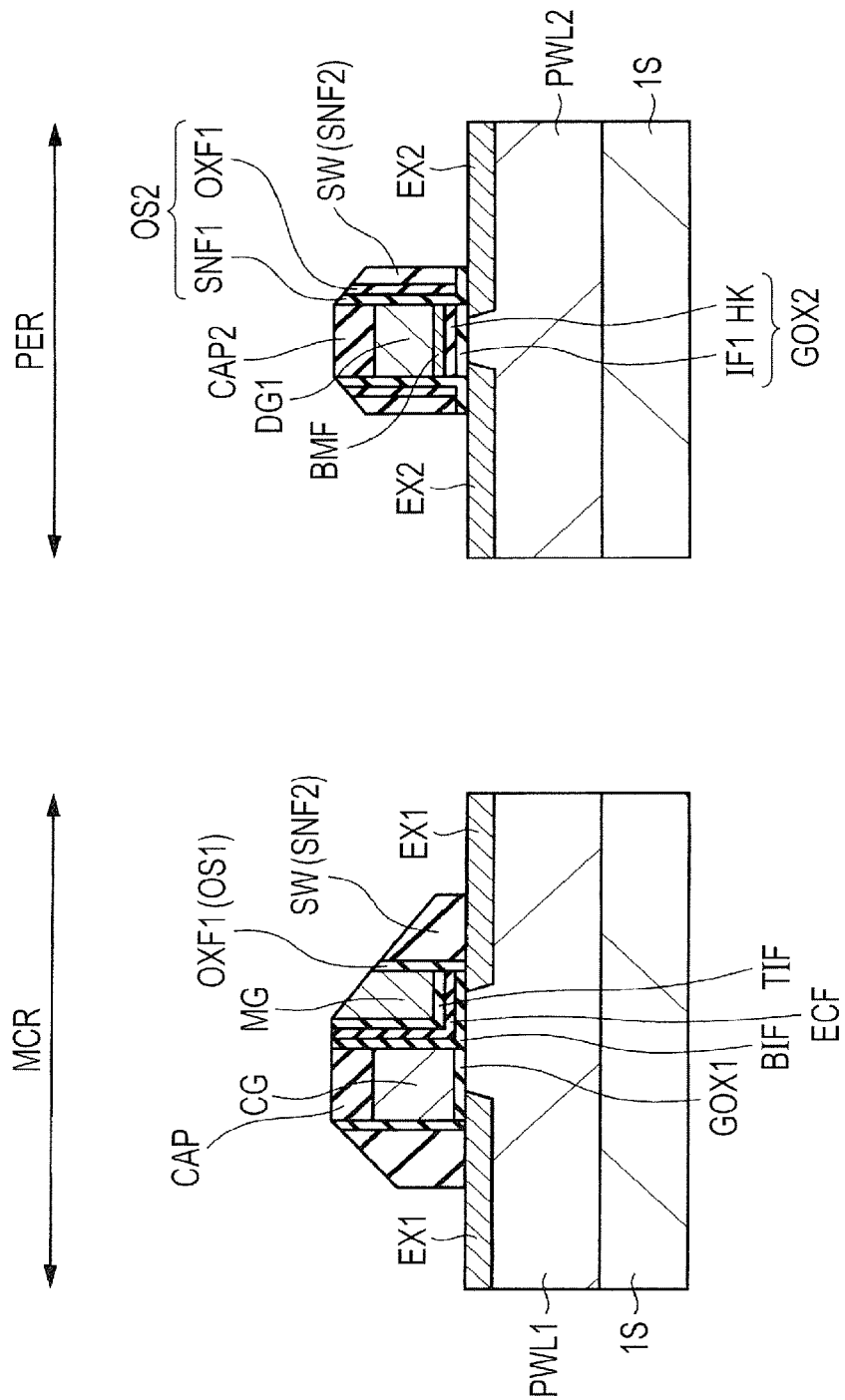
FIG. 21 is a sectional view illustrating a manufacturing step of the semiconductor device, following FIG. 20.

Thereafter, the silicon nitride film SNF2 is formed over the semiconductor substrate 1S, and the sidewall spacer SW is formed by performing etch-back with the use of anisotropic etching (FIG. 21.) Herein, for example, the sidewall SW to be formed in the memory cell formation region MCR is formed such that the width thereof is wide, while the sidewall SW to be formed in the peripheral circuit formation region PER is formed such that the width thereof is narrow.

The subsequent steps are the same as those in the aforementioned First Embodiment, and hence description thereof will be omitted.

Also in Second Embodiment, the performance of each of the non-volatile memory and the HKMG-MISFET can be improved by forming the offset spacers with materials that are suitable for the memory cell MC1 and the MISFET Q1, respectively, and are different from each other.

In Second Embodiment, however, the offset spacer OS2 in the MISFET Q1 in the peripheral circuit formation region PER is formed by a laminated film of the silicon nitride film SNF1 and the silicon oxide film OXF1. In this case, the silicon oxide film OXF1 does not directly contact the high dielectric constant film HK, but the silicon oxide film OXF1, serving as a source for supplying oxygen, is present in the offset spacer OS2. With respect to this point, it can be considered that, because the thickness of the silicon oxide film OXF1 is small and the silicon oxide film OXF1 does not directly contact the high dielectric constant film HK, an influence exerted on variations in the characteristics of the high dielectric constant film HK is not so great. However, there is in any way the possibility that the silicon oxide film OXF1 may serve as a source for diffusing oxygen, and hence the configuration of the offset spacer OS2 in the aforementioned First Embodiment is more desirable from the viewpoint of suppressing variations in the characteristics of the MISFET Q1 formed in the peripheral circuit formation region PER.

Third Embodiment

Manufacturing Method of Semiconductor Device (Gate Last+HK Last)

Because the manufacturing method of a semiconductor device in Third Embodiment is almost the same as that in First Embodiment, description will be made, focusing on different points.

Figure 22:
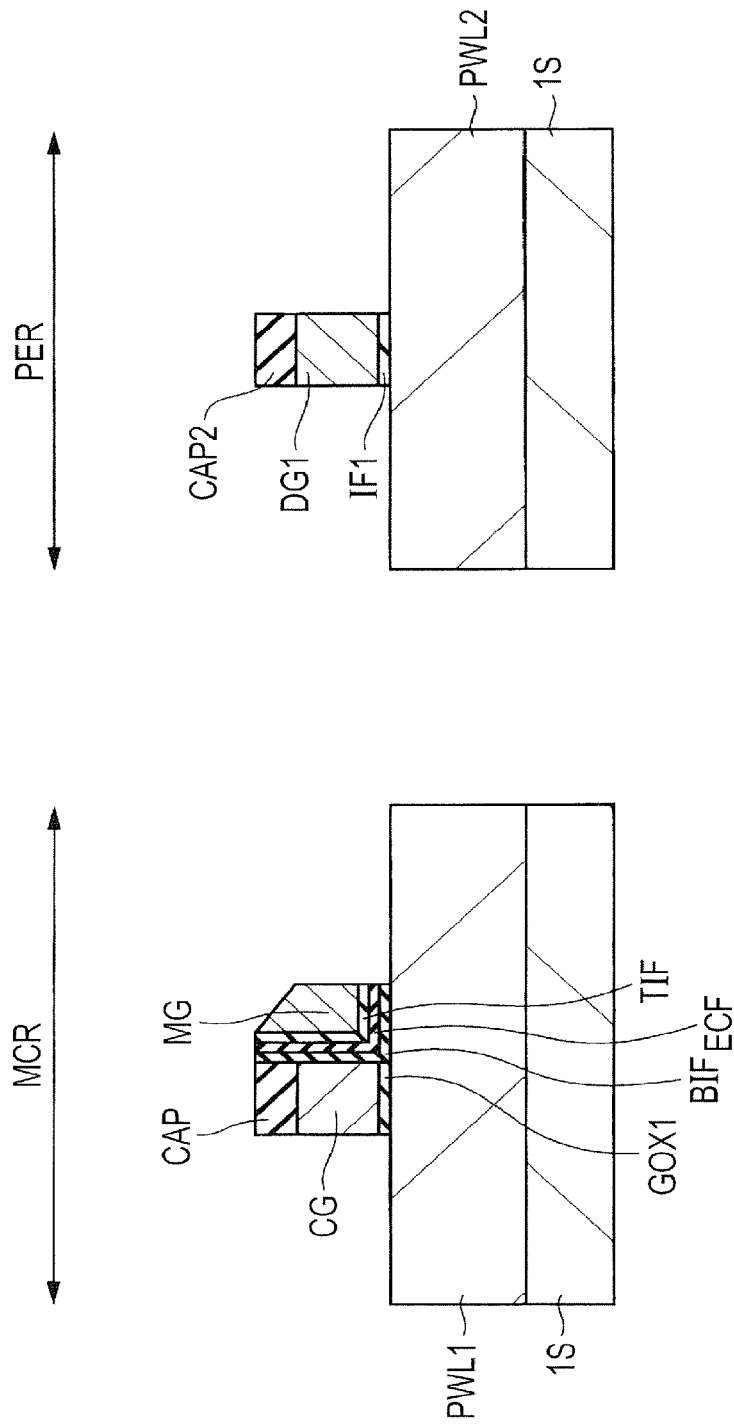
FIG. 22 is a sectional view illustrating a manufacturing step of a semiconductor device in Third Embodiment.

The dummy gate electrode DG1 and the insulating film IF1 including, for example, a silicon oxide film are formed in the peripheral circuit formation region PER by patterning with the use of a photolithography technique and a dry etching technique (see FIG. 22.)

Figure 23:
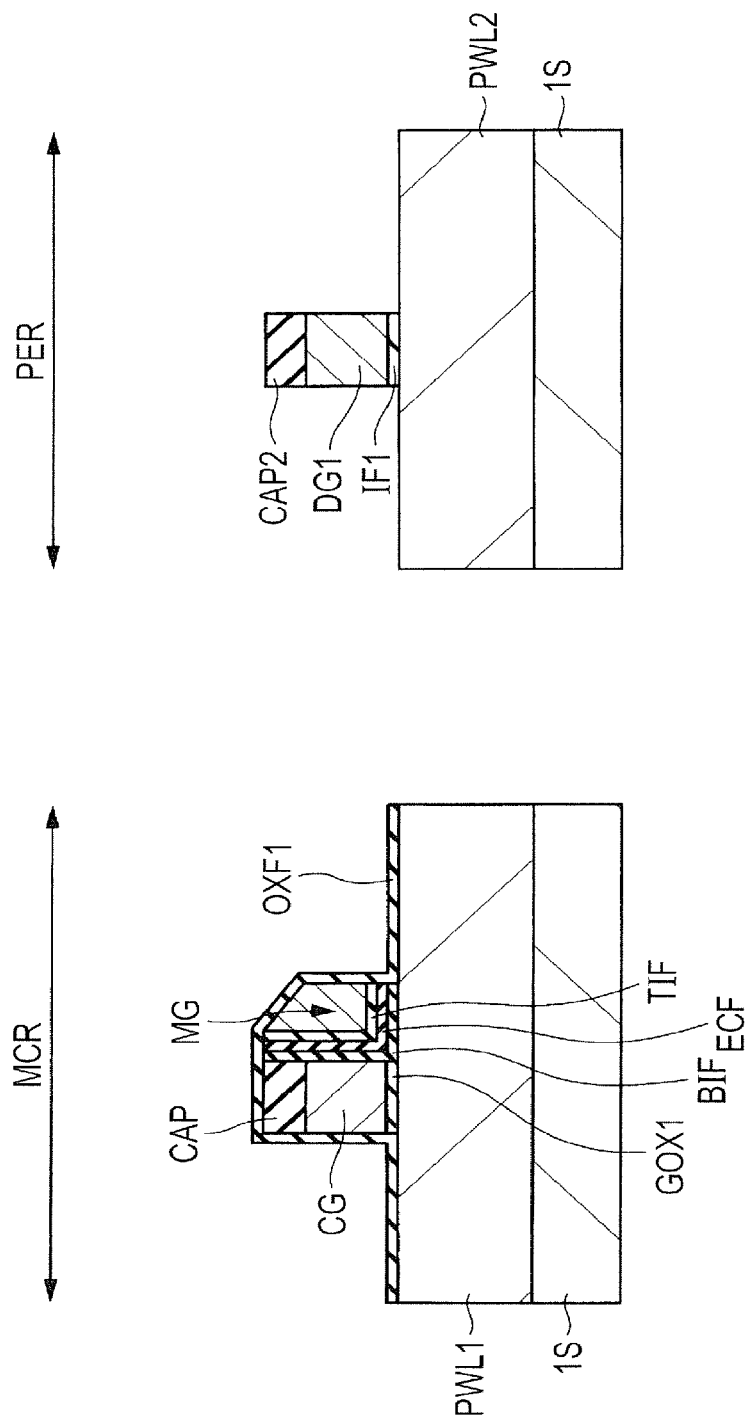
FIG. 23 is a sectional view illustrating a manufacturing step of the semiconductor device, following FIG. 22.

Subsequently, the silicon oxide film OXF1 is formed over the semiconductor substrate 1S, which is then caused to remain only in the memory cell formation region MCR by a photolithography technique and wet etching, thereby allowing the silicon oxide film OXF1, covering the control gate electrode CG and the memory gate electrode MG, to be formed (see FIG. 23.) At the time, the silicon oxide film OXF1 formed in the peripheral circuit formation region PER is removed.

Figure 24:
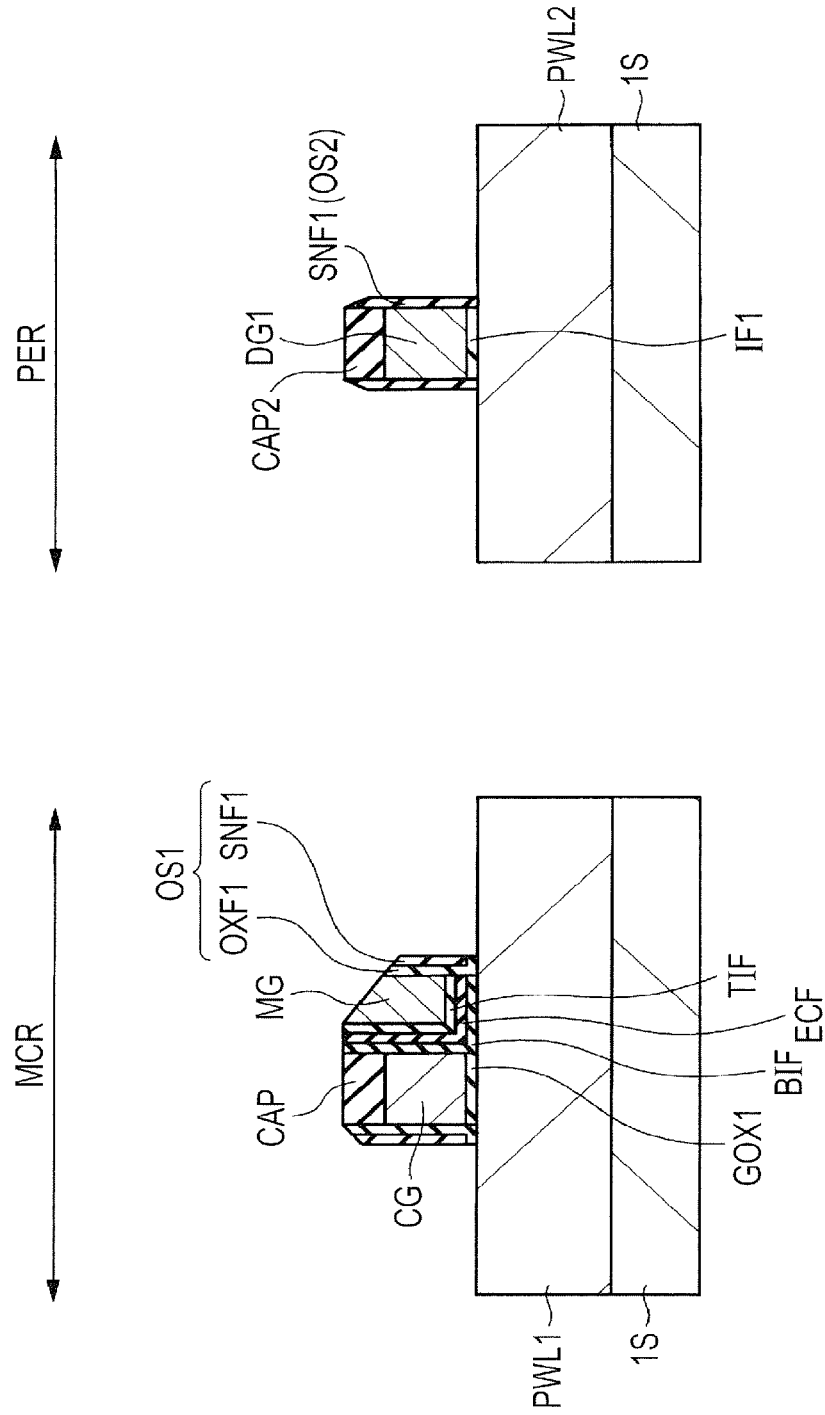
FIG. 24 is a sectional view illustrating a manufacturing step of the semiconductor device, following FIG. 23.

Subsequently, after the silicon nitride film SNF1 is formed over the semiconductor substrate 1S, the silicon nitride film SNF1 is etched back by anisotropic dry etching. Thereby, the offset spacer OS1 including the silicon oxide film OXF1 and the silicon nitride film SNF1 is formed near to the drain of the control gate electrode CG and near to the source of the memory gate electrode MG, and the offset spacer OS2 including the silicon nitride film SNF1 is formed over the sidewalls on both the sides of the dummy gate electrode DG1 formed in the peripheral circuit formation region PER (see FIG. 24.)

In the way described above, the offset spacer OS2 formed in the peripheral circuit formation region PER is formed by a single layer structure of the silicon nitride film SNF1, while the offset spacer OS1 formed in the memory cell formation region MCR is formed by a laminated structure in which the silicon nitride film SNF1 is laminated over the silicon oxide film OXF1. In this case, the silicon nitride film SNF1 is formed over the silicon oxide film OXF1 in the offset spacer OS1 formed in the memory cell formation region MCR, but the offset spacer OS1 may be formed by a single layer structure of the silicon oxide film OXF1 with the silicon nitride film SNF1 removed. In this case, however, a mask for removing the silicon nitride film SNF1 is required.

Figure 25:
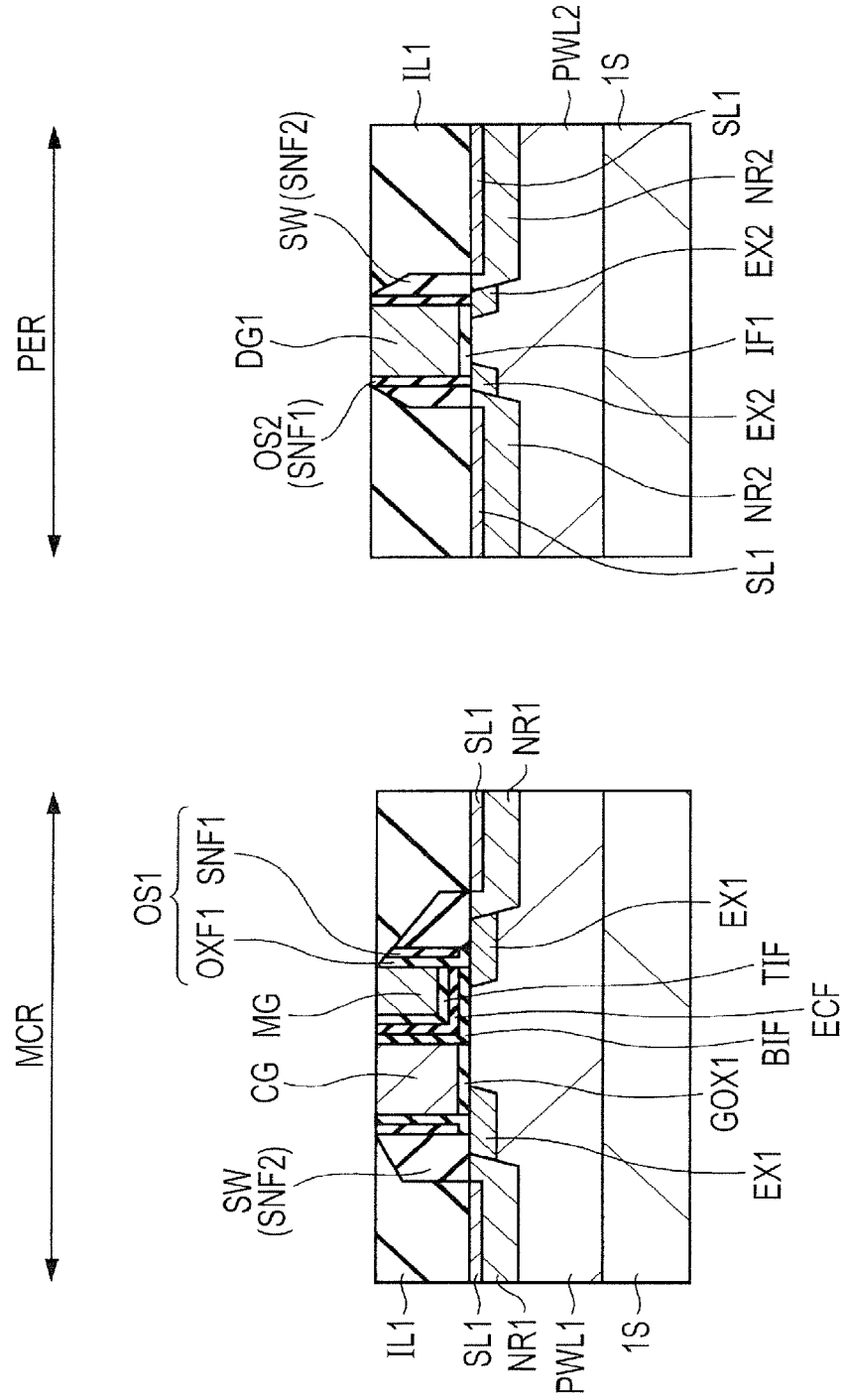
FIG. 25 is a sectional view illustrating a manufacturing step of the semiconductor device, following FIG. 24.
Figure 26:
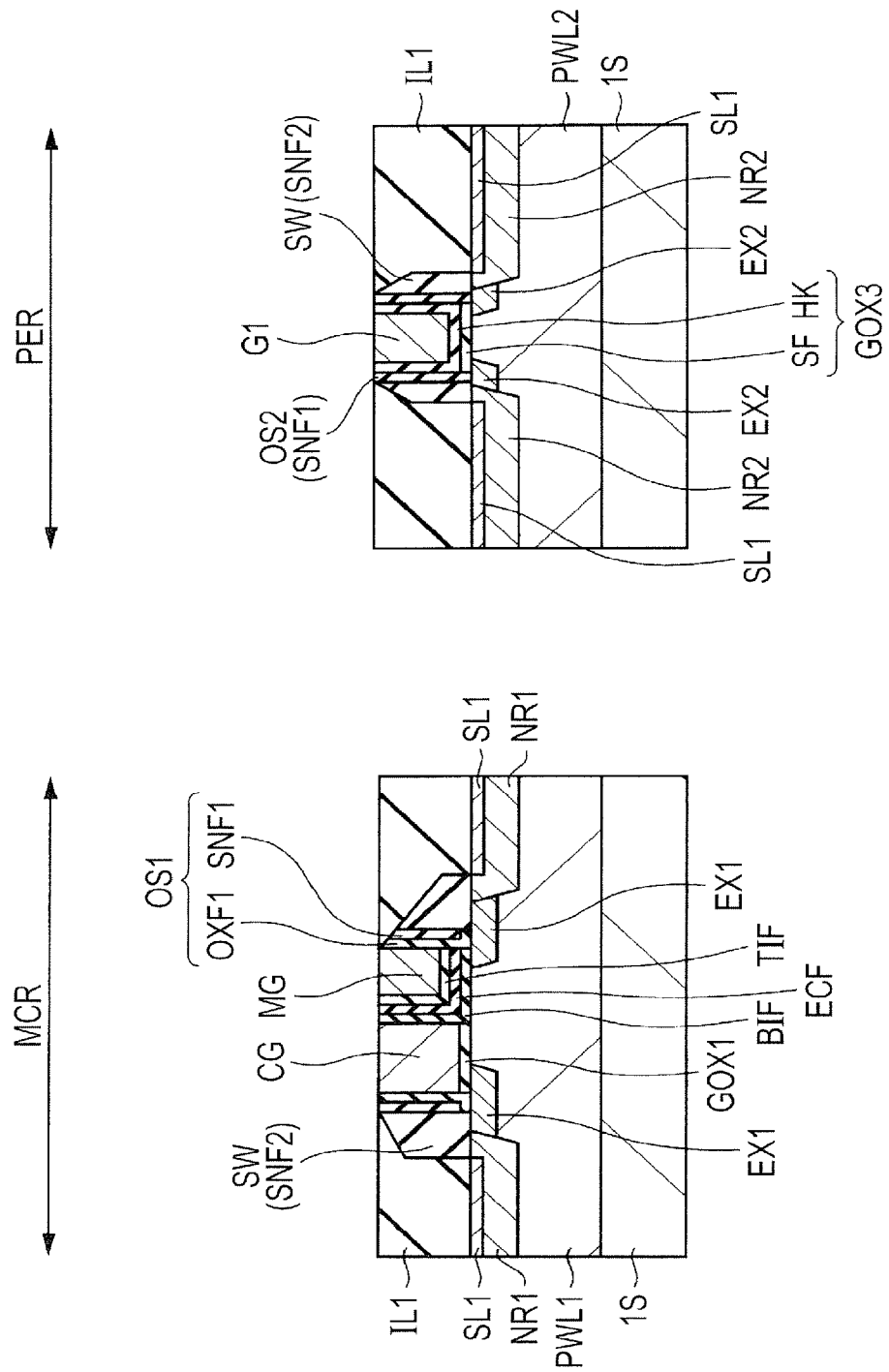
FIG. 26 is a sectional view illustrating a manufacturing step of the semiconductor device, following FIG. 25.

Thereafter, the same steps as those of the manufacturing method of a semiconductor device in First Embodiment are performed, and the interlayer insulating film IL1 is then formed over the semiconductor substrate 1S, the surface of which is then polished by a CMP process. Thereby, the upper surface of the dummy gate electrode DG1 is exposed in the peripheral circuit formation region PER (see FIG. 25.) Then, the dummy gate electrode DG1 formed in the peripheral circuit formation region PER is removed, and the insulating film IF1 (interface layer) below the dummy gate electrode DG1 is also removed. Thereafter, an interface layer (silicon oxide film) SF is formed again over the bottom surface of a trench portion formed by removing the dummy gate electrode DG1, and the high dielectric constant film HK is then formed over the internal wall of the trench portion. Thereby, a gate insulating film GOX3 including the interface layer SF and the high dielectric constant film HK is formed. Then, a metal film for work function adjustment (not illustrated) and a low-resistance metal film, such as, for example, an aluminum film, are embedded in the trench portion, and flattening is then performed by a CMP process. Thereby, the metal film is caused to remain only in the trench, allowing the gate electrode G1 to be formed (see FIG. 26.)

The subsequent steps are the same as the manufacturing steps of a semiconductor device in First Embodiment. In the way described above, the semiconductor device according to Third Embodiment can be manufactured.

Advantages in Third Embodiment

In the present Third Embodiment, the high dielectric constant film HK is formed over the internal wall of a trench portion formed by removing the dummy gate electrode DG1, and is formed, for example, after activation annealing is performed on the conductive impurities contained in the source region and the drain region. Accordingly, the high dielectric constant film HK is hardly influenced by the diffusion of oxygen (oxidant), resulting from a heat treatment, and hence the advantage that variations in the characteristics of the high dielectric constant film HK, resulting from the entry of oxygen, are suppressed can be obtained. Even in Third Embodiment, however, a step is present, in which, after the high dielectric constant film HK is formed, a silicide film is formed over the surfaces of the control gate electrode CG and the memory gate electrode MG in the memory cell MC1. Accordingly, there is the possibility that oxygen may enter the high dielectric constant film HK by the diffusion thereof, resulting from a heat load applied in this step; however, the offset spacer OS2 in the MISFET Q1 is formed by the silicon nitride film SNF1 and the silicon nitride film is formed to surround the high dielectric constant film HK also in Third Embodiment, and hence the entry of oxygen into the high dielectric constant film HK can be suppressed. That is, in the manufacturing steps of a semiconductor device in Third Embodiment, the step of forming the high dielectric constant film HK is performed later than that of the manufacturing steps thereof in First Embodiment. As a result, variations in the characteristics of the high dielectric constant film HK can be effectively suppressed by a synergistic effect obtained by the facts: that the possibility that oxygen may enter the high dielectric constant film HK, occurring due to the diffusion of oxygen resulting from a heat treatment, is reduced; and that the offset spacer OS2 in the MISFET Q1 is formed by the silicon nitride film SNF1, thereby allowing the performance of the MISFET to be improved.

Modification

Figure 27:
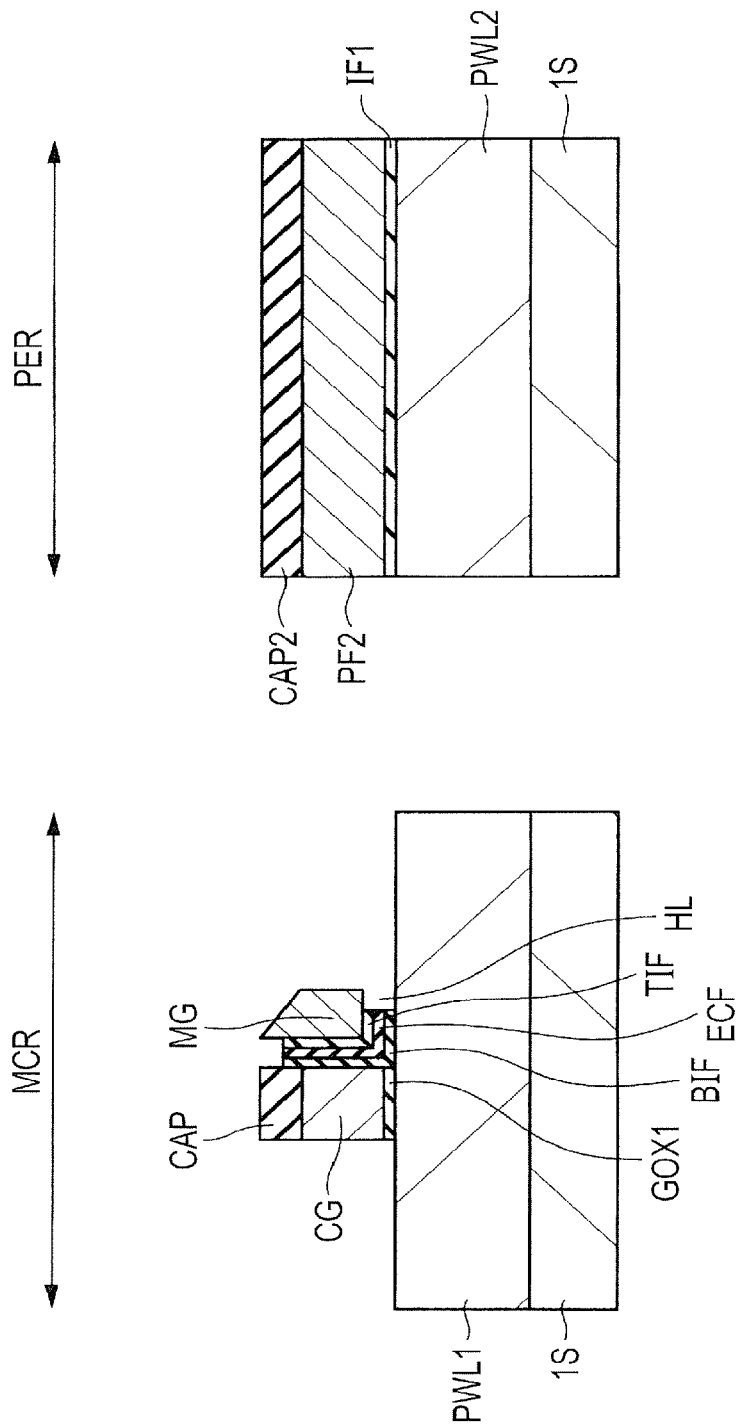
FIG. 27 is a sectional view illustrating a manufacturing step of a semiconductor device in a modification.

Subsequently, a modification in Third Embodiment will be described. In the present modification, the insulating film TIF in the upper layer of the ONO film (laminated insulating film) exposed from the memory gate electrode MG, the charge storage film ECF in the intermediate layer of the ONO film, and the insulating film BIF in the lower layer of the ONO film are removed, for example, by wet etching. At the time, the side end portion of the ONO film is retreated from the side surface of the memory gate electrode MG, and as a result, a concave portion HL is formed below the side surface of the memory gate electrode MG (see FIG. 27.)

Thereafter, the cap insulating film CAP2 including the polysilicon film PF2 and a silicon nitride film is formed over the whole surface of the semiconductor substrate 1S. Subsequently, the cap insulating film CAP2 including the polysilicon film PF2 and the silicon nitride film and formed in the memory cell formation region MCR is completely removed by a photolithography technique and a dry etching technique (see FIG. 27.)

Figure 28:
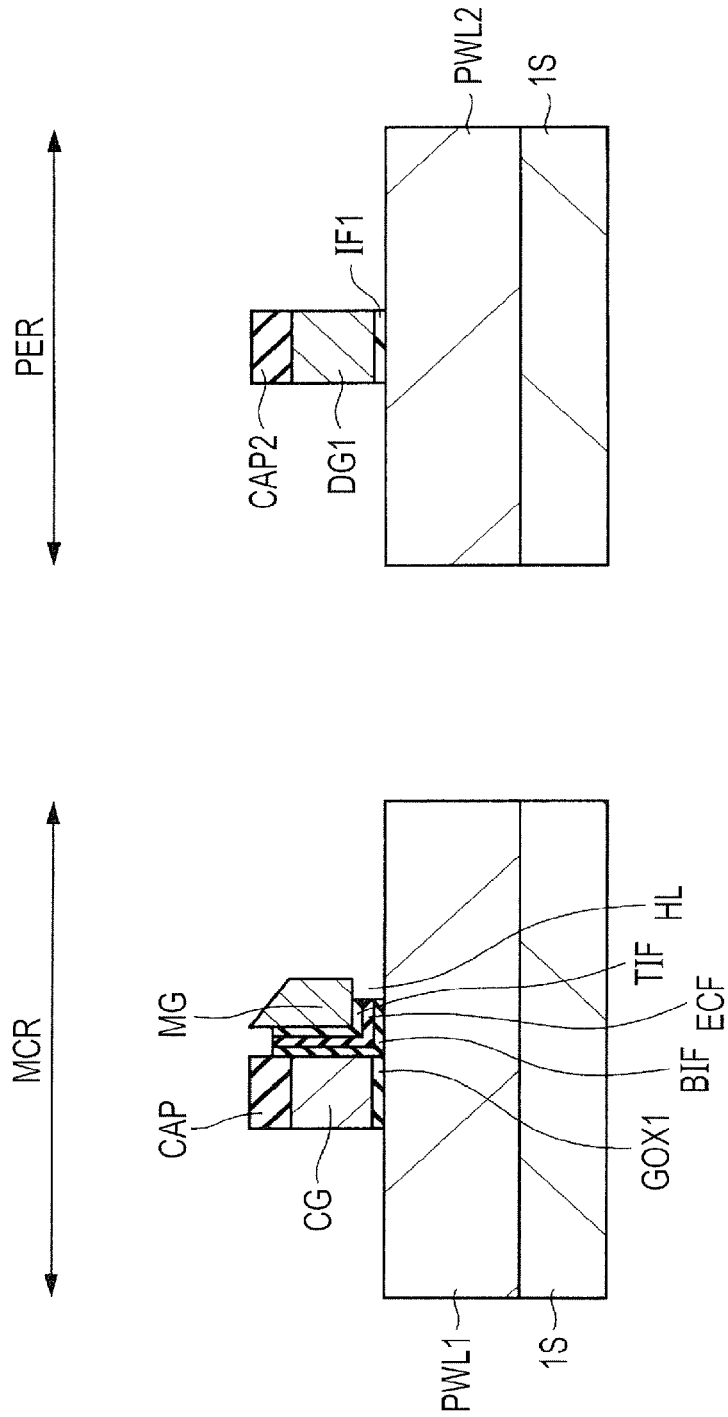
FIG. 28 is a sectional view illustrating a manufacturing step of the semiconductor device, following FIG. 27.

Subsequently, the dummy gate electrode DG1 is formed in the peripheral circuit formation region PER by patterning with the use of a photolithography technique and a dry etching technique (see FIG. 28.)

Figure 29:
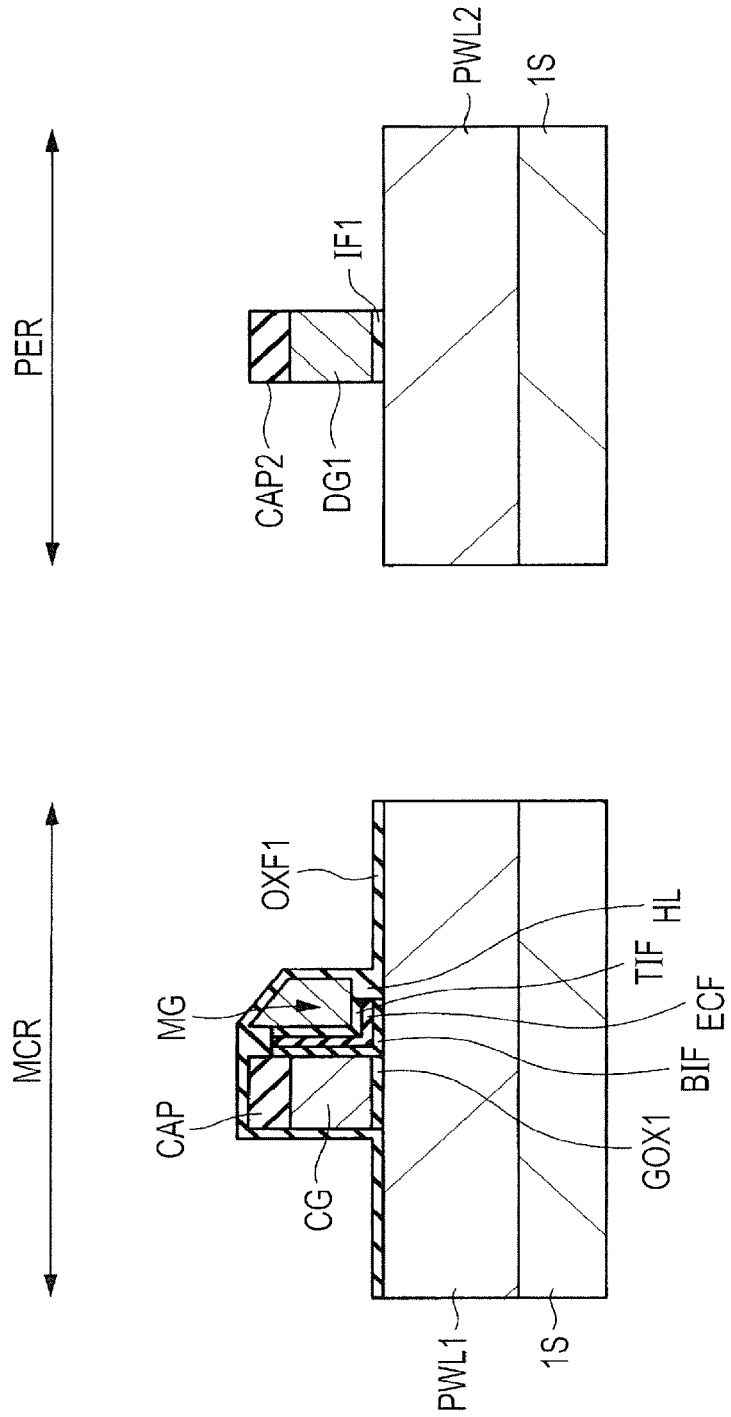
FIG. 29 is a sectional view illustrating a manufacturing step of the semiconductor device, following FIG. 28.

Then, the silicon oxide film OXF1 is formed over the semiconductor substrate 1S, which is then caused to remain only in the memory cell formation region MCR by a photolithography technique and wet etching, thereby allowing the silicon oxide film OXF1, covering the control gate electrode CG and the memory gate electrode MG, to be formed (see FIG. 29.) At the time, the silicon oxide film OXF1 formed in the peripheral circuit formation region PER is removed.

Herein, the silicon oxide film OXF1 is embedded in the concave portion HL in the present modification. Thereby, the end portion of the ONO film directly contacts the silicon oxide film OXF1 at the concave portion HL sandwiched between the end portion of the memory gate electrode MG and the semiconductor substrate 1S, and hence an excessive charge trap is not formed between the end portion of the memory gate electrode MG and the semiconductor substrate 1S. Accordingly, an increase in threshold voltage, occurring in the end portion of the memory gate electrode MG, can be suppressed, the increase being caused with hot electrons, generated at the end of the source while information are being written into the memory cell MC1, being stored in the end portion of the memory gate electrode MG. As a result, a non-volatile memory excellent in rewriting characteristics (endurance) can be achieved even when the concave portion HL is formed between the end portion of the memory gate electrode MG and the semiconductor substrate 1S.

Fourth Embodiment

A split gate type non-volatile memory has been described in the aforementioned First Embodiment to Third Embodiment, but the technical ideas in the embodiments are not limited thereto but can also be applied to a single gate type non-volatile memory.

Figure 30:
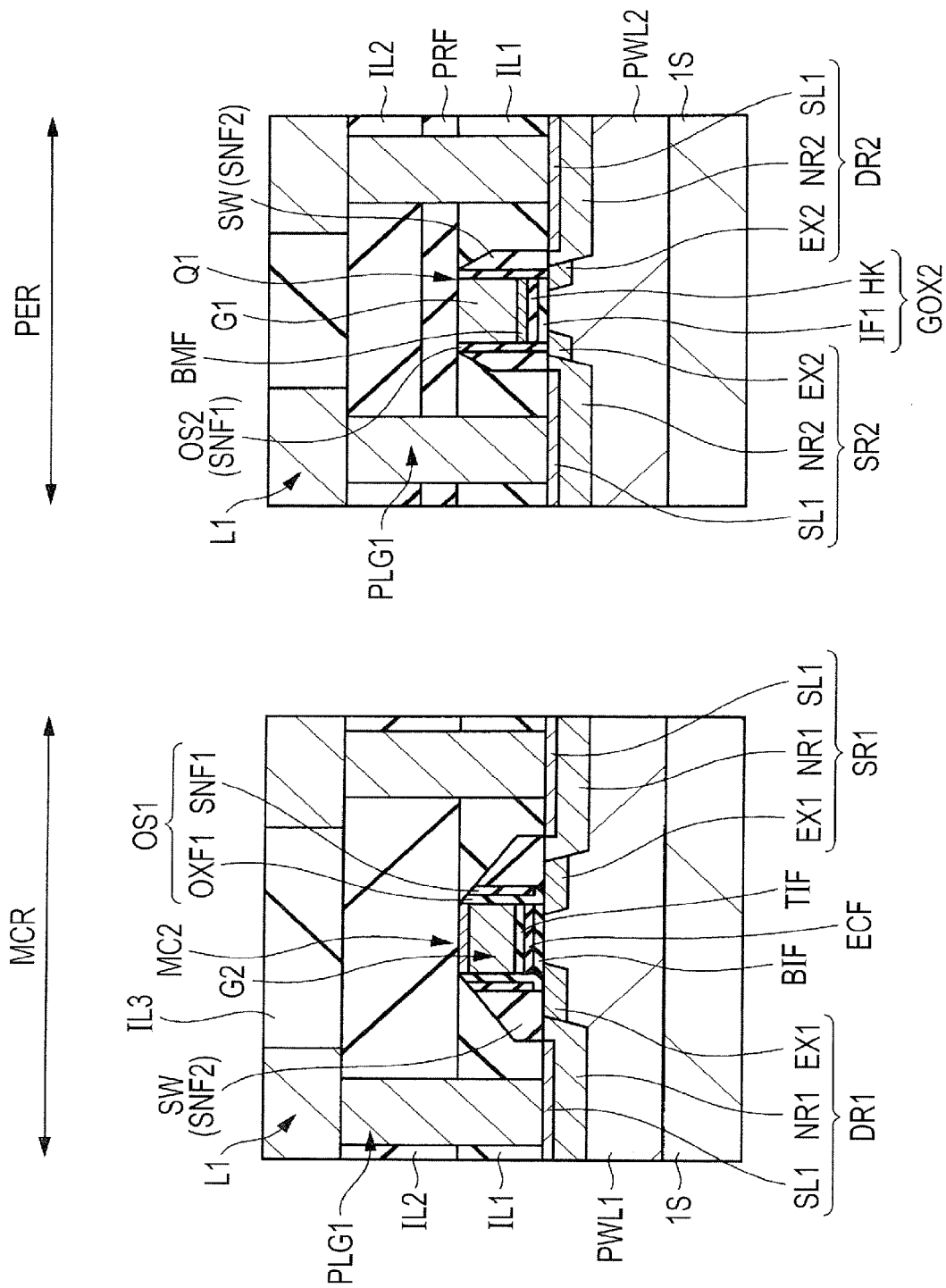
FIG. 30 is a sectional view illustrating a configuration of a semiconductor device in Fourth Embodiment.

FIG. 30 is a sectional view illustrating the configurations of the MISFET Q1 formed in the peripheral circuit formation region PER and a single gate type memory cell MC2 formed in the memory cell formation region MCR. In FIG. 30, the memory cell MC2 in the present Fourth Embodiment has the insulating film BIF formed over the semiconductor substrate 1S, the charge storage film ECF formed over the insulating film BIF, and the insulating film TIF formed over the charge storage film ECF. The memory cell MC2 in Fourth Embodiment has the gate electrode G2 over the insulating film TIF, and the offset spacer OS1, including both the silicon oxide film OXF1 that directly contacts the sidewall of the gate electrode G2 and the side end portion of the charge storage film ECF and the silicon nitride film SNF1 formed over the silicon oxide film OXF1, is formed. Further, the sidewall spacer SW including the silicon nitride film SNF2 is formed outside the offset spacer OS1. Furthermore, in the semiconductor substrate 1S, the source region SR1 is formed by: the shallow low-concentration impurity diffusion region EX1 on one side; the deep high-concentration impurity diffusion region NR1 on one side; and the silicide film SL1, while the drain region DR1 is formed by: the shallow low-concentration impurity diffusion region EX1 on the other side; the deep high-concentration impurity diffusion region NR1 on the other side; and the silicide film SL1.

Even in the memory cell MC2 in Fourth Embodiment that is thus formed, the silicon oxide film OXF1 not having a charge storage function is formed to directly contact the side end portion of the charge storage film ECF. Thereby, an increase in the threshold voltage in the vicinity of the end portion of the memory gate electrode MG, resulting from the storage of charges into the offset spacer OS1, can be suppressed in the memory cell MC2. As a result, according to the non-volatile memory in Fourth Embodiment, degradation of a transconductance (gm), which is a ratio of a change in a drain current to a change in a gate voltage, and a decrease in a read-out current can be suppressed, and as a result, the performance of the non-volatile memory can be improved.

The invention made by the present inventors has been specifically described above based on its preferred embodiments, but it is needless to say that the invention should not be limited to the embodiments and may be modified variously within a range not departing from the gist thereof.

What is claimed is:
1. A semiconductor device comprising:
   a semiconductor substrate having a memory cell formation region and a peripheral circuit formation region;
   a memory cell formed in the memory cell formation region; and
   a field-effect transistor formed in the peripheral circuit formation region,
   wherein the memory cell comprises:
      a first gate insulating film formed on the semiconductor substrate located in the memory cell formation region, and including a charge storage film formed of silicon nitride;
      a memory gate electrode formed on the first gate insulating film; and
      a first offset spacer contacting each of a sidewall of the memory gate electrode and a side end portion of the charge storage film so as to cover a side surface of the first gate insulating film, and formed of silicon oxide, and
   wherein the field-effect transistor comprises:
      a second gate insulating film formed on the semiconductor substrate located in the peripheral circuit formation region, and including a high dielectric constant film having a dielectric constant higher than that of a silicon nitride film,
      a gate electrode formed on the second gate insulating film, and
      a second offset spacer contacting each of a sidewall of the gate electrode and a side end portion of the high dielectric constant film so as to cover a side surface of the second gate insulating film, and formed of silicon nitride.
2. The semiconductor device according to claim 1, wherein the first gate insulating film is formed on the semiconductor substrate without a conductive film therebetween.
3. The semiconductor device according to claim 2, wherein the first gate insulating film formed of:
   a lower layer insulating film formed on the semiconductor substrate;
   the charge storage film formed on the lower layer insulating film; and
   an upper layer insulating film formed on the charge storage film.
4. The semiconductor device according to claim 3, wherein each of the lower layer insulating film and the upper layer insulating film is formed of silicon oxide.
5. The semiconductor device according to claim 1, wherein the memory cell has a first sidewall spacer formed on the sidewall of the memory gate electrode via the first offset spacer,
   wherein the field-effect transistor has a second sidewall spacer formed on the sidewall of the gate electrode via the second offset spacer, and
   wherein each of the first sidewall spacer and the second sidewall spacer is formed of silicon nitride.
6. The semiconductor device according to claim 1, wherein the memory cell comprises:
   a source region and a drain region formed in the semiconductor substrate; and
   a control gate electrode formed on the semiconductor substrate so as to be adjacent to a side surface opposite to the side surface of the memory gate electrode on which the first offset spacer is formed, and
   wherein the control gate electrode and the memory gate electrode are formed on the semiconductor substrate located between the source region and the drain region.
7. The semiconductor device according to claim 1, wherein the gate electrode is formed of aluminum.

8. The semiconductor device according to claim 1,
wherein the first offset spacer includes a silicon oxide film contacting each of the sidewall of the memory gate electrode and the side end portion of the charge storage film, and a silicon nitride film formed on the sidewall of the memory gate electrode via the silicon oxide film.

9. The semiconductor device according to claim 3,
wherein a thickness of the upper layer insulating film is larger than or equal to a thickness of the lower layer insulating film.

10. The semiconductor device according to claim 1,
wherein the high dielectric constant film contains a metal compound.

11. The semiconductor device according to claim 10,
wherein the high dielectric constant film includes a hafnium oxide film, a hafnium aluminate film, a hafnium oxynitride film, a hafnium silicate film, or a hafnium silicon oxynitride film.

\* \* \* \* \*